US012016152B2

(12) United States Patent
Dandurand et al.

(10) Patent No.: US 12,016,152 B2
(45) Date of Patent: Jun. 18, 2024

(54) COOLING SYSTEM FOR A PRINTER

(71) Applicant: Runbeck Election Services Inc., Phoenix, AZ (US)

(72) Inventors: Robert Dandurand, Phoenix, AZ (US); Anthony Paiz, Phoenix, AZ (US)

(73) Assignee: Runbeck Election Services Inc., Phoenix, AZ (US)

( * ) Notice: Subject to any disclaimer, the term of this patent is extended or adjusted under 35 U.S.C. 154(b) by 206 days.

(21) Appl. No.: 17/751,447

(22) Filed: May 23, 2022

(65) Prior Publication Data

US 2022/0377936 A1 Nov. 24, 2022

Related U.S. Application Data

(60) Provisional application No. 63/202,005, filed on May 21, 2021.

(51) Int. Cl.
*H05K 7/20* (2006.01)
*G03G 21/20* (2006.01)

(52) U.S. Cl.
CPC ....... *H05K 7/20172* (2013.01); *G03G 21/206* (2013.01); *H05K 7/20145* (2013.01); *G03G 2221/1645* (2013.01)

(58) Field of Classification Search
CPC ..... H05K 7/20; H05K 7/20136–20145; H05K 7/20154; H05K 7/20172; H05K 7/20445; H05K 5/00; H05K 5/02; H05K 5/0213; H01L 23/34; H01L 23/367; H01L 23/3675; H01L 23/46–467; F04D 29/4226; F04D 29/626; F04D 29/646; F04D 25/12; F24F 7/007; F25D 2323/00284; G03G 15/00; G03G 21/00; G03G 21/20; G03G 21/206; G03G 2221/1645; G06F 1/20
See application file for complete search history.

(56) References Cited

U.S. PATENT DOCUMENTS

| | | | | |
|---|---|---|---|---|
| 5,185,941 A | * | 2/1993 | Dongelmans | F04D 29/703 454/355 |
| 5,630,469 A | * | 5/1997 | Butterbaugh | H01L 23/467 174/16.3 |
| 7,411,788 B2 | * | 8/2008 | Liang | G06F 1/20 361/695 |
| 2004/0247431 A1 | * | 12/2004 | Chen | H05K 7/20181 415/182.1 |
| 2005/0041392 A1 | * | 2/2005 | Chen | H05K 7/20727 361/695 |
| 2009/0162195 A1 | * | 6/2009 | Nelson | F04D 29/646 415/219.1 |
| 2013/0023199 A1 | * | 1/2013 | Li | H05K 7/20181 454/355 |
| 2013/0149168 A1 | * | 6/2013 | Sun | H05K 7/20172 416/244 R |
| 2013/0202429 A1 | * | 8/2013 | Kuo | G06F 1/183 415/213.1 |
| 2013/0240183 A1 | * | 9/2013 | Sun | G01F 1/20 165/121 |

(Continued)

*Primary Examiner* — Amir A Jalali
(74) *Attorney, Agent, or Firm* — POLSINELLI PC

(57) ABSTRACT

Various embodiments of an adapted cooling system for a printer are disclosed herein. The adapted cooling system includes a panel for installment along a housing of the printer and further includes a manifold that couples a more powerful fan to the printer.

18 Claims, 27 Drawing Sheets

(56) References Cited

U.S. PATENT DOCUMENTS

| | | | |
|---|---|---|---|
| 2016/0004215 A1* | 1/2016 | Yamashita | G03G 15/20 |
| | | | 399/92 |
| 2019/0118609 A1* | 4/2019 | Harms | B60H 1/00885 |
| 2020/0108606 A1* | 4/2020 | Burke | B41J 2/1752 |

* cited by examiner

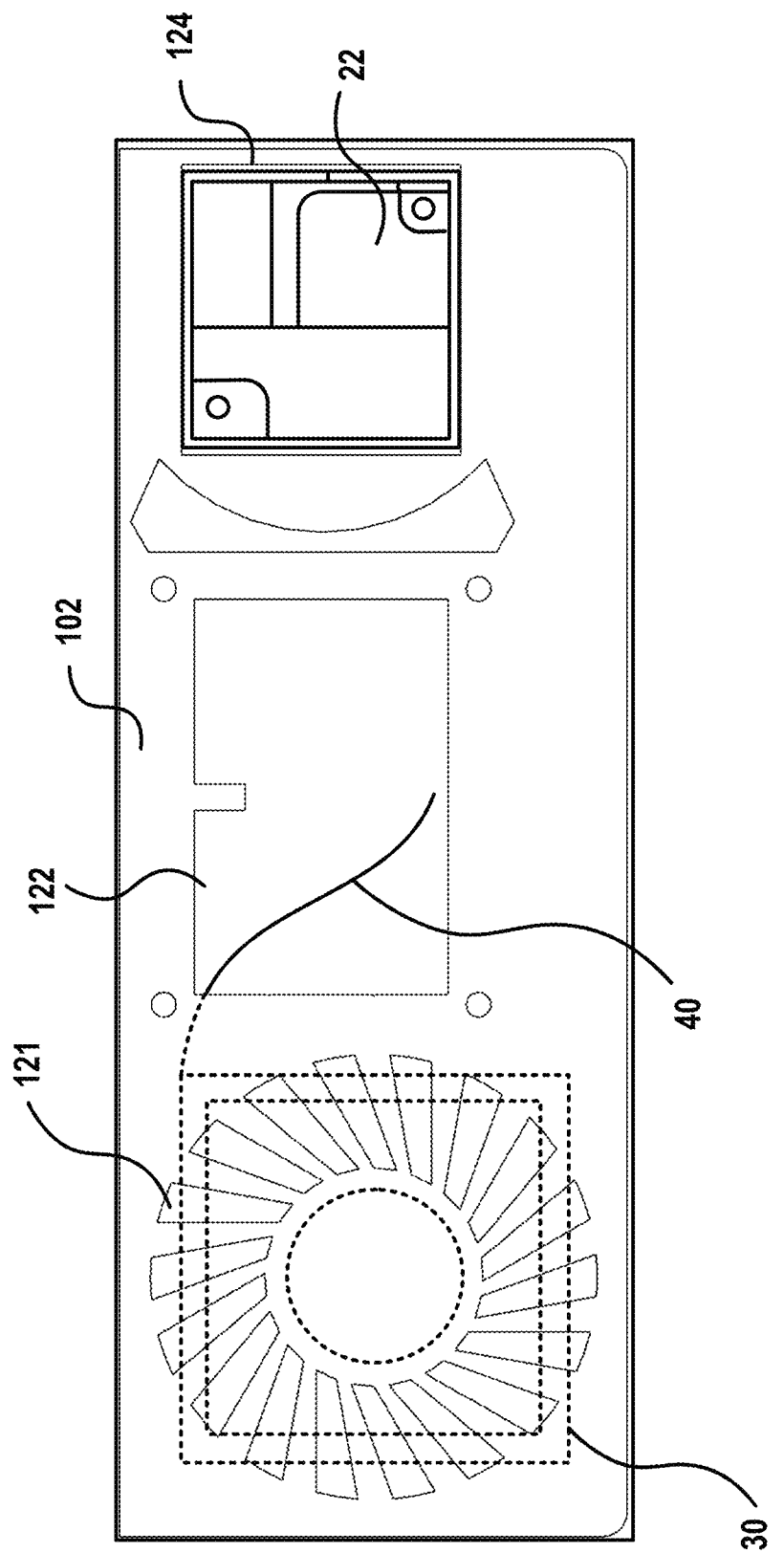

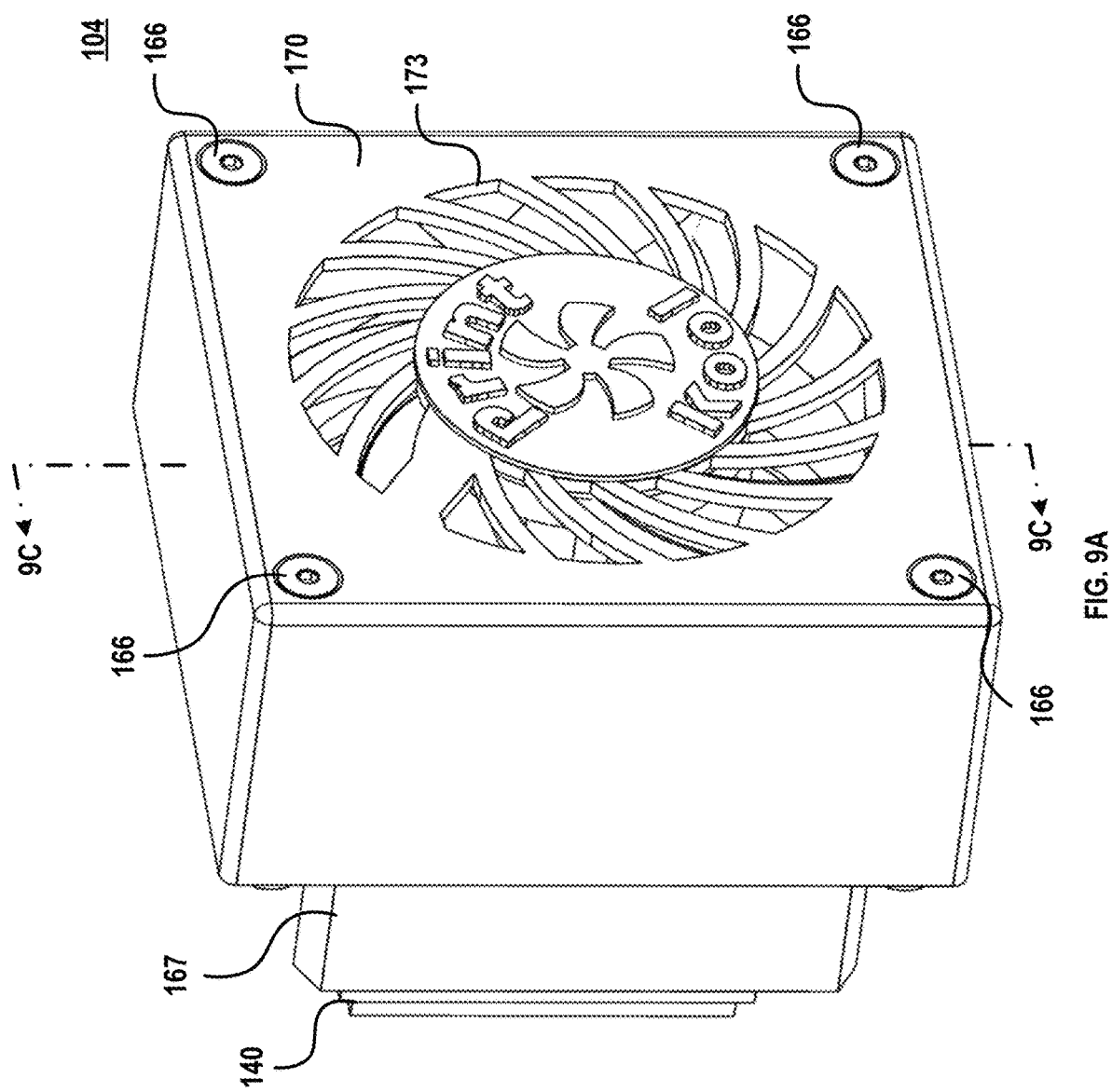

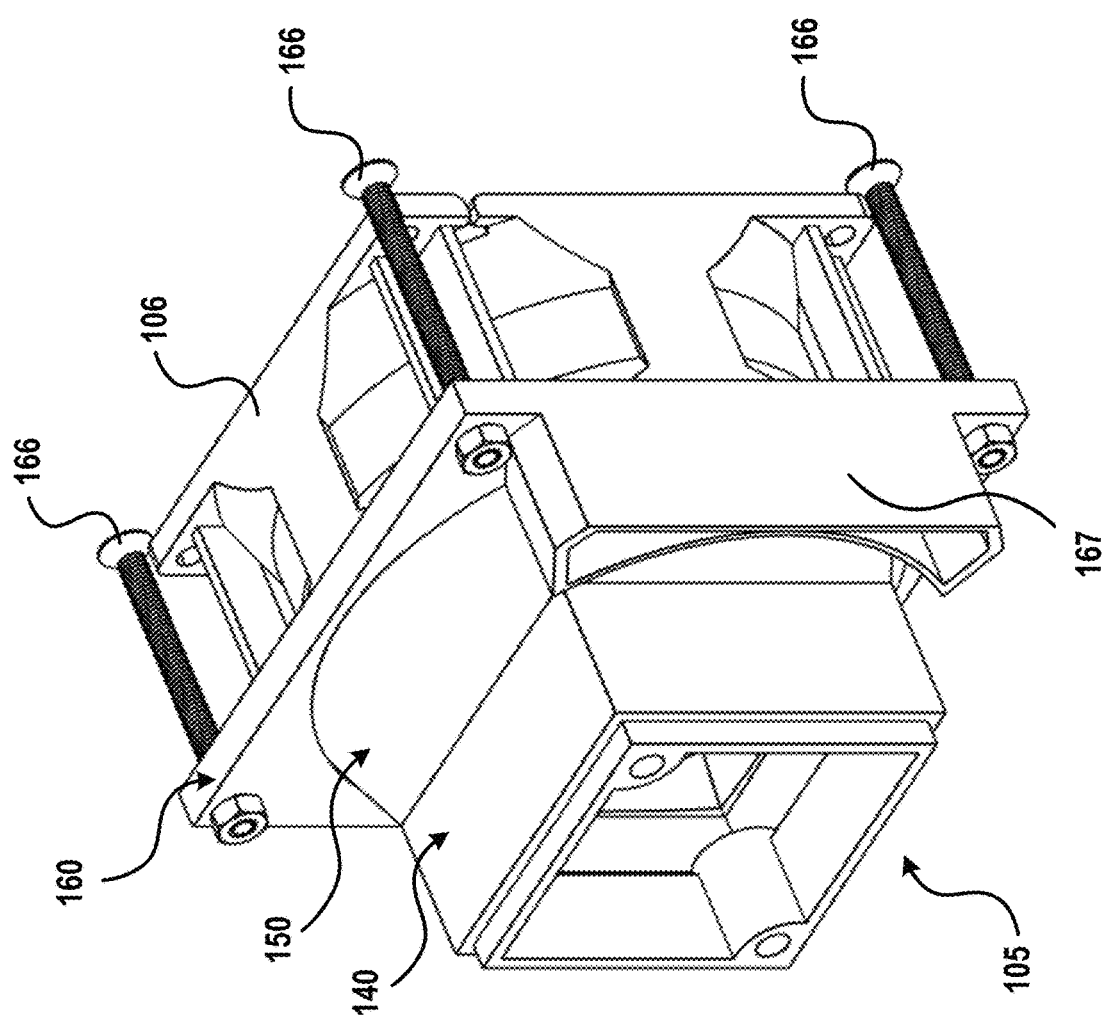

200

| 210 | PROVIDE A PRINTER HAVING A PRINTER HOUSING AND A VENTILATION BAY |

| 220 | FORM A PANEL OF AN ADAPTED COOLING SYSTEM INCLUDING A PLURALITY OF VENT APERTURES AND A MANIFOLD PORT, THE PANEL CONFIGURED FOR INSTALLMENT ALONG A PRINTER HOUSING AND THE MANIFOLD PORT DEFINING A MANIFOLD RECEPTACLE AND AN ARCUATE SLOT |

| 230 | FORM A CHANNEL SECTION OF A MANIFOLD CONFIGURED FOR COUPLING WITH THE PANEL AND A FAN |

| 232 | FORM A REAR CHANNEL SECTION DEFINING A REAR CHANNEL BODY HAVING A FIRST OPEN END AND AN INTERIOR CHANNEL, THE FIRST OPEN END BEING CONFIGURED FOR INSERTION WITHIN THE MANIFOLD RECEPTACLE OF THE MANIFOLD PORT |

| 234 | FORM AN INTERMEDIATE TAPERED SECTION DEFINING AN INTERMEDIATE TAPERED BODY HAVING A TAPERED INTERIOR CHANNEL |

| 236 | FORM A PLATE RING DEFINING A PLATE RING BODY HAVING AN INWARD-FACING PLATE SURFACE, AN OUTWARD-FACING PLATE SURFACE DEFINED OPPOSITE TO THE INWARD-FACING PLATE SURFACE, THE INWARD-FACING PLATE SURFACE DEFINING AN ARCUATE PROTRUSION CONFIGURED FOR ENGAGEMENT WITHIN THE ARCUATE SLOT OF THE MANIFOLD PORT |

COOLING SYSTEM FOR A PRINTER

CROSS-REFERENCE TO RELATED APPLICATIONS

This is a non-provisional application that claims benefit to U.S. Provisional Patent Application Ser. No. 63/202,005 filed 21 May 2021 which is herein incorporated by reference in its entirety.

FIELD

The present disclosure generally relates to computer cooling systems, and in particular, a system and associated method for an improved cooling system adapter for a printer to accommodate applications that generate additional heat when printing elections documents.

BACKGROUND

Election ballot printing systems are commonly required by law to adhere to various paper and printing regulations that can be considered nonstandard for most consumer printing preferences. However, print jobs for larger print paper sizes generate additional heat. In other words, printing machines and devices configured for bulk print jobs lack sufficient technology for printing elections documents with elections specific parameters such as larger paper and different dimensions; especially in view of the increased heat issues that can arise.

It is with these observations in mind, among others, that various aspects of the present disclosure were conceived and developed.

BRIEF DESCRIPTION OF THE DRAWINGS

FIGS. 5A and 5B are respective perspective and front views showing engagement of a panel of the adapted cooling system of FIG. 1 within a ventilation bay of the printer of FIG. 3A;

FIGS. 9A and 9B are respective front perspective and rear perspective views showing the manifold of the adapted cooling system of FIG. 1;

FIGS. 10A and 10B are respective front perspective and rear perspective views showing the manifold of the adapted cooling system of FIG. 9A with a fan cover removed;

FIGS. 14A and 14B are a series of process diagrams showing a simplified method of manufacture and assembly of the adapted cooling system of FIG. 1.

Corresponding reference characters indicate corresponding elements among the view of the drawings. The headings used in the figures do not limit the scope of the claims.

DETAILED DESCRIPTION

Figure 1:
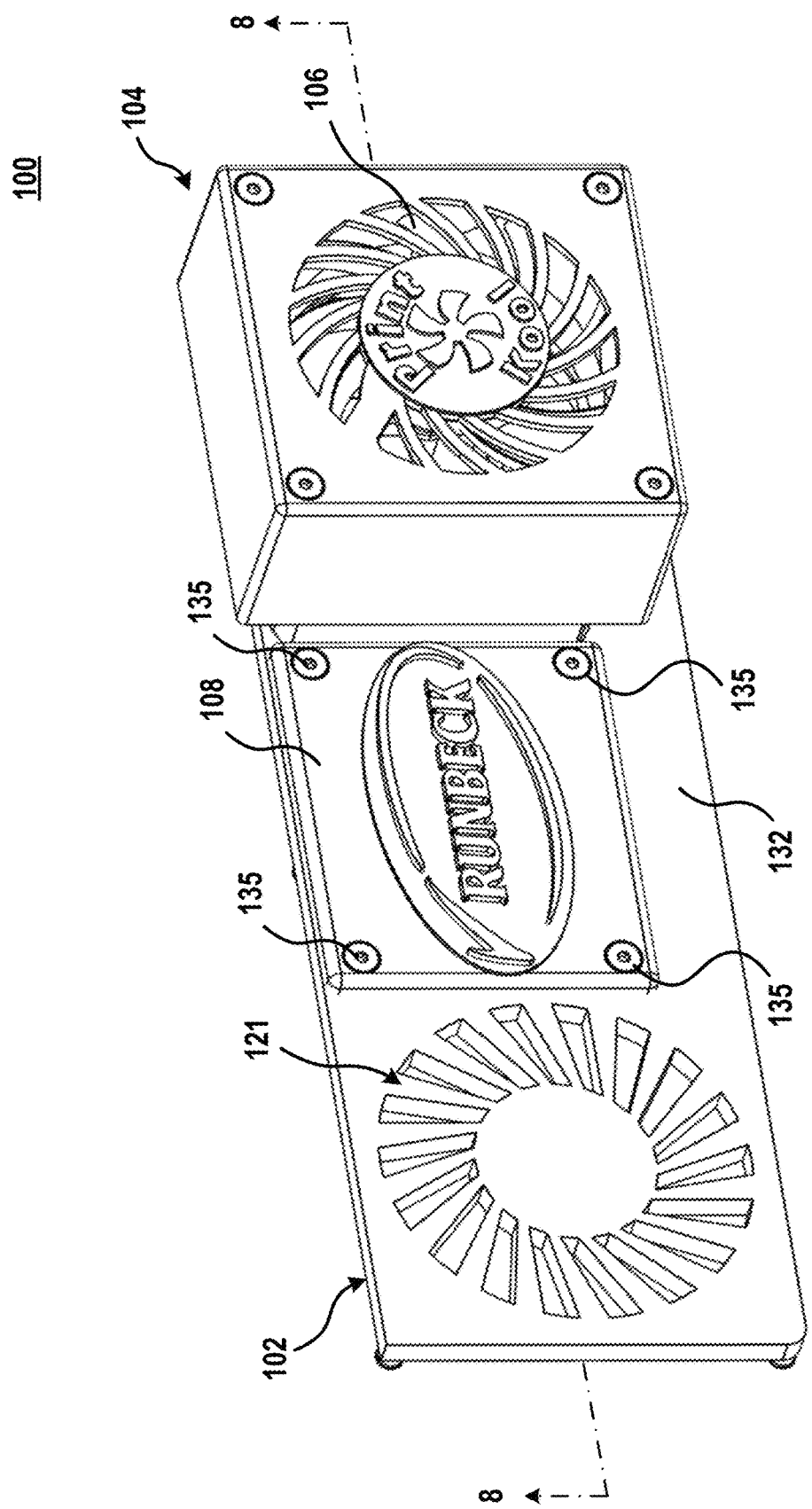
FIG. 1 is a front perspective view showing an adapted cooling system for retrofitting along a housing of an electronic device, such as a printer housing of a printer.
Figure 2:
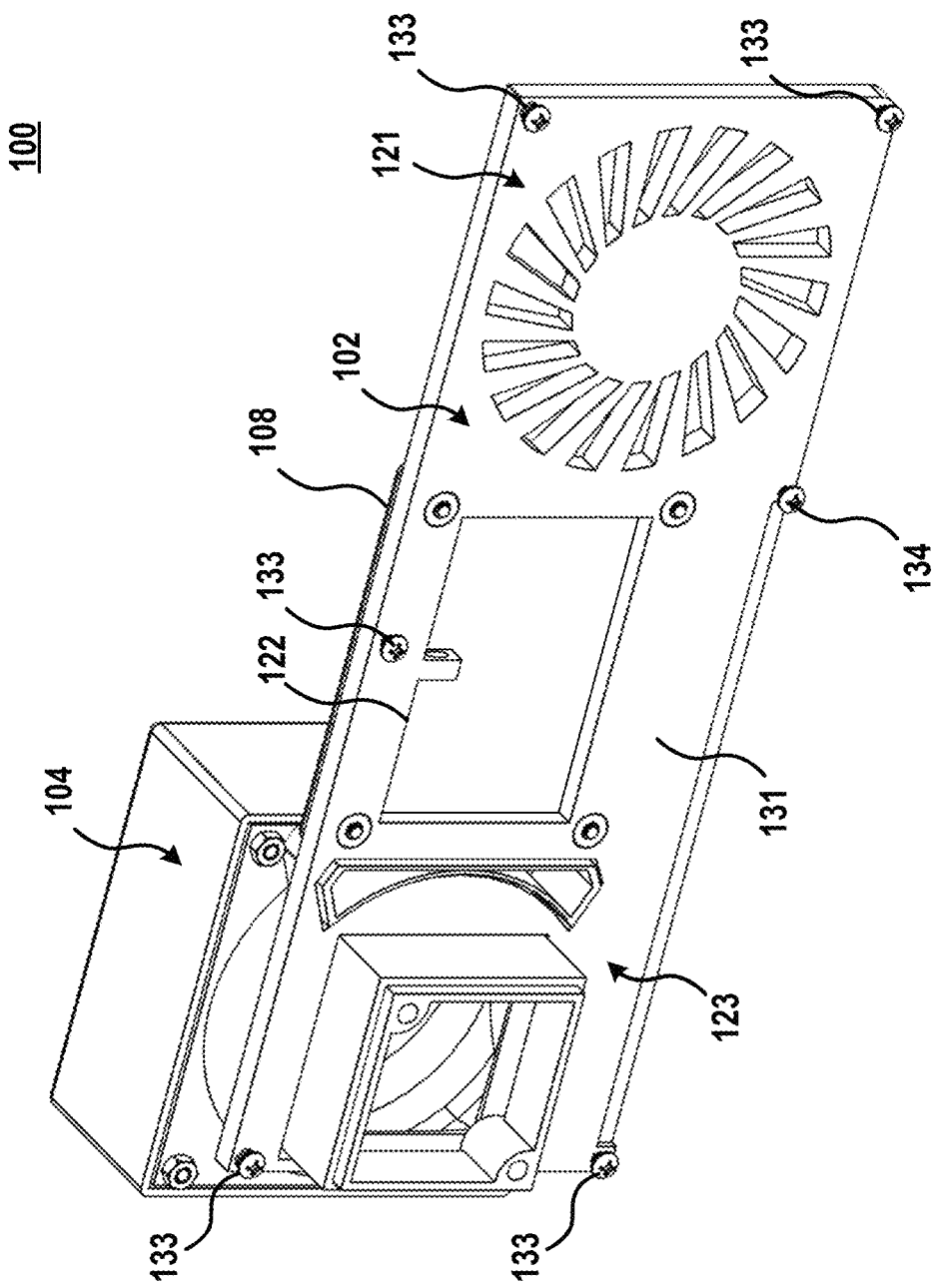
FIG. 2 is a rear perspective view showing the adapted cooling system of FIG. 1.

Various embodiments of a system and associated method for a cooling system adapter for a printer or other electronic device are described herein. In particular, the cooling system adapter is configured to enable a conventional printer to receive an alternative fan with appropriate power for cooling the conventional printer during unconventional print jobs such as election documents. The system includes a panel that can be installed along a housing of the conventional printer, the panel including a manifold that supports the alternative fan and directs air into or out of the housing. The manifold further provides a cable channel for passage of cables between the conventional printer and the fan. Since most conventional printers include existing vent apertures that are only appropriately sized for its original fan and do not accommodate the airflow needs of more powerful fans, the panel further includes a vent aperture that is appropriately sized to the alternative fan to equalize air pressure inside the printer relative to the outside and promote improved cooling. The panel further includes an access sub-panel for access to associated wires or cables for the fan and connections with the printer.

Adapted Cooling System Overview

With initial reference to FIGS. 1-3B, an adapted cooling system 100 includes a panel 102 that is configured for engagement along a housing of an electronic device, including a printer housing 12 of a printer 10 or another computer-implemented appliance that generates substantial heat. Conventional printers such as printer 10 are often used for industrial print jobs, particularly for printing ballots and other election documents that use paper having unconventional dimensions. As such, the process of mass-printing ballots and other documents of similar size can cause conventional printers to overheat, resulting in excessive printer downtime and even destruction. However, it is not always cost-effective to purchase and/or design industrial printers that are specially sized for mass printing of larger documents and paper dimensions. As such, the adapted cooling system 100 can provide a cost-effective option for adapting a conventional printer such as printer 10 for mass-printing documents of unconventional dimensions. In a primary embodiment, the adapted cooling system 100 adapts a conventional printer such as printer 10 to include a more powerful fan and provides sufficient ventilation to accommodate the more powerful fan.

With continued reference to FIGS. 1-3B and with additional reference to FIGS. 3C-5B, the adapted cooling system 100 includes the panel 102 that couples along the printer housing 12 of the printer 10. The panel 102 provides a manifold 104 that couples a fan 106 to the printer housing 12 for improved airflow and cooling during operation of the printer 10. The fan 106 can be configured to draw air into the printer housing 12 or out of the printer housing 12 and can replace an existing fan of the printer 10 for improved cooling, where the existing fan is considerably less powerful than the fan 106 of the adapted cooling system 100. In particular, with reference to FIGS. 3C-4, the fan 106 replaces an original fuser chamber fan 20 that communicates directly with a chamber (not shown) within the printer 10 that houses a fuser unit (not shown), the original fuser chamber fan 20 being configured to force hot air away from the fuser unit and outside the printer 10. The original fuser chamber fan 20 is not powerful enough to sufficiently cool the fuser unit when printing on large paper such as election documents. In some embodiments, the original fuser chamber fan 20 is rated to draw air out of the housing 12 at a rate of about 25 cubic feet per minute (CFM), and the fan 106 that replaces the original fuser chamber fan 20 can be rated to draw about 90-100 CFM. However, it should be noted that the original fuser chamber fan 20 and the fan 106 that replaces the original fuser chamber fan 20 are not limited to these values.

Figure 3B:
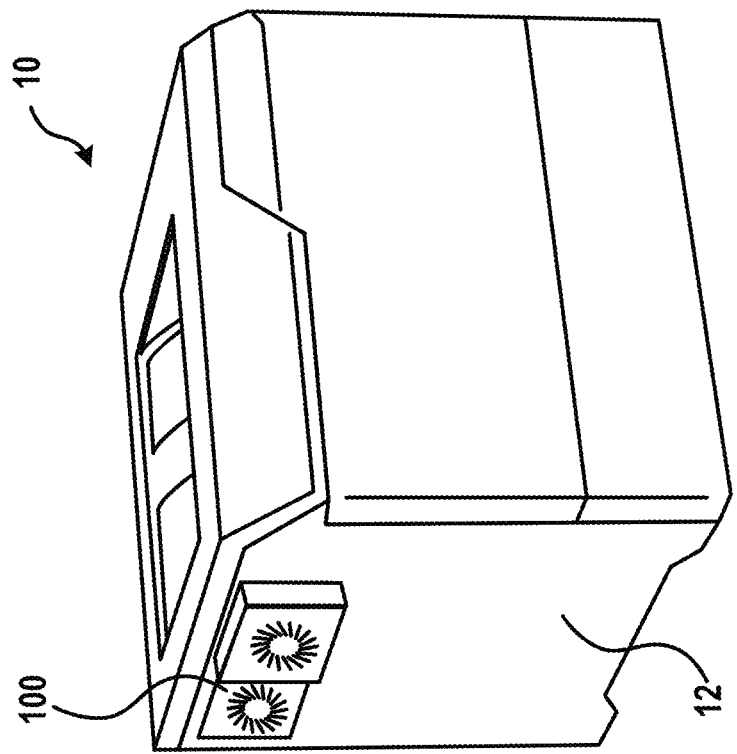
FIGS. 3A and 3B are perspective views respectively showing a prior art printer with an original vent panel and the printer of FIG. 3A with the adapted cooling system of FIG. 1 retrofitted onto the printer housing of the printer of FIG. 3A.
Figure 3A:
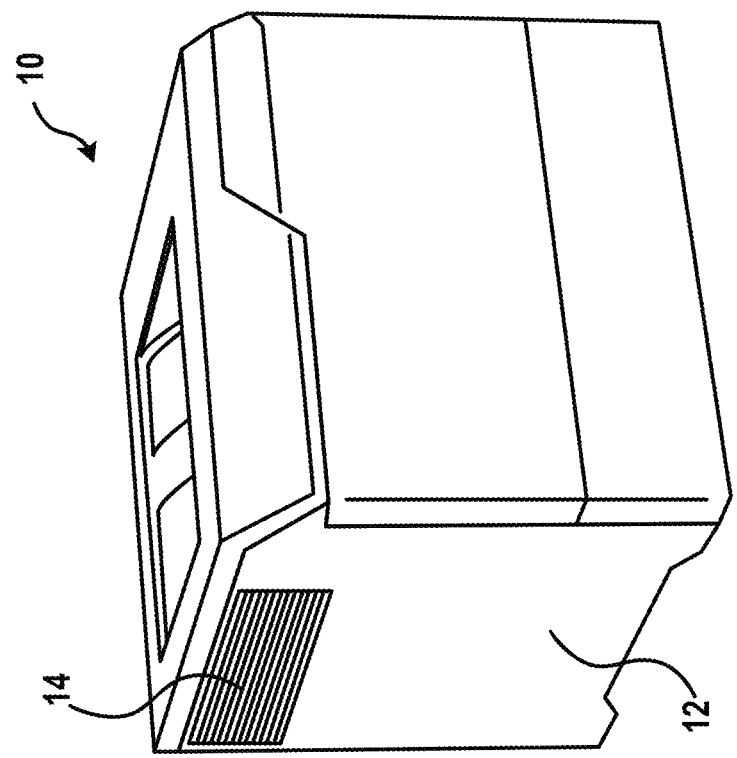
Figure 3C:
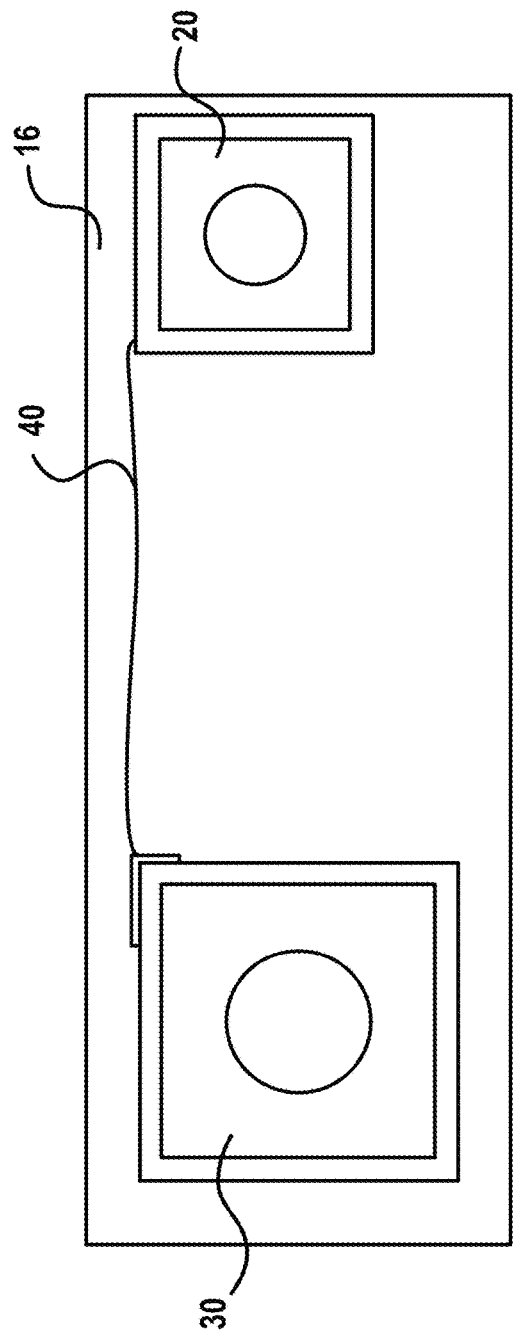
FIGS. 3C and 3D are front views showing a ventilation bay of the printer of FIG. 3A that respectively show an original fuser chamber fan and a fuser chamber fan receptacle.
Figure 3D:
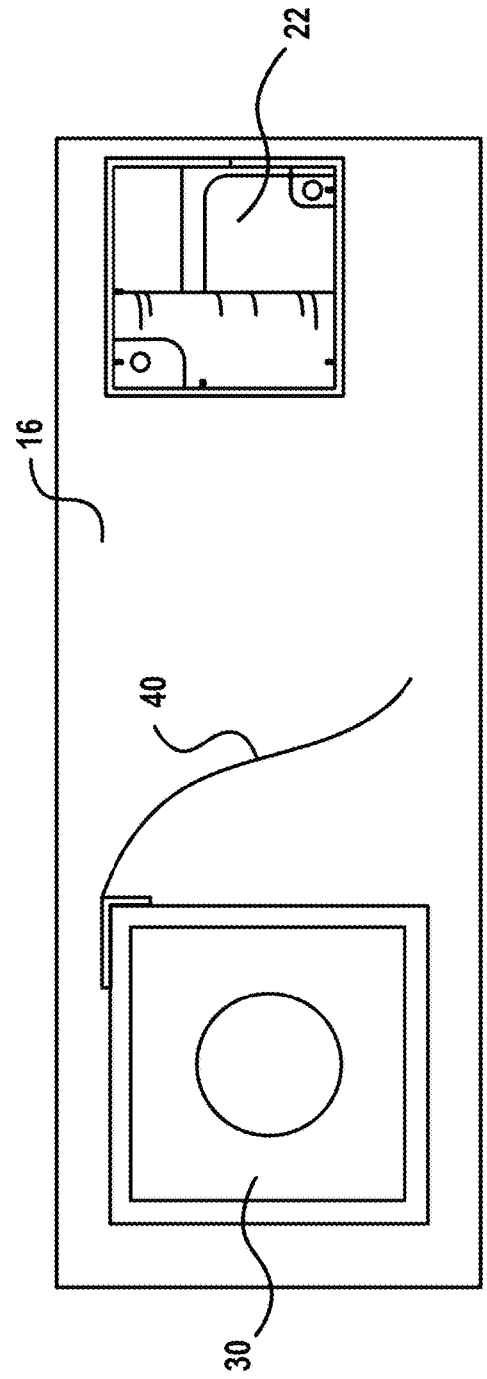

FIGS. 3C and 3D illustrate a ventilation bay 16 that houses the original fuser chamber fan 20 and a second fan 30 that draws hot air out of other areas within the printer housing 12. The original fuser chamber fan 20 includes a plurality of cables 40 that communicate power and/or control signals between the original fuser chamber fan 20 and one or more internal components of the printer 10. The original fuser chamber fan 20 can be removed to expose a fuser chamber fan receptacle 22 that eventually communicates with the chamber (not shown) within the printer 10 that houses the fuser unit (not shown). As will be discussed in greater detail herein, the adapted cooling system 100 includes the manifold 104 that couples the fan 106 to the fuser chamber fan receptacle 22 so that the fan 106 can draw hot air away from the fuser unit and force the hot air outside of the printer housing 12 of the printer 10.

Figure 4:
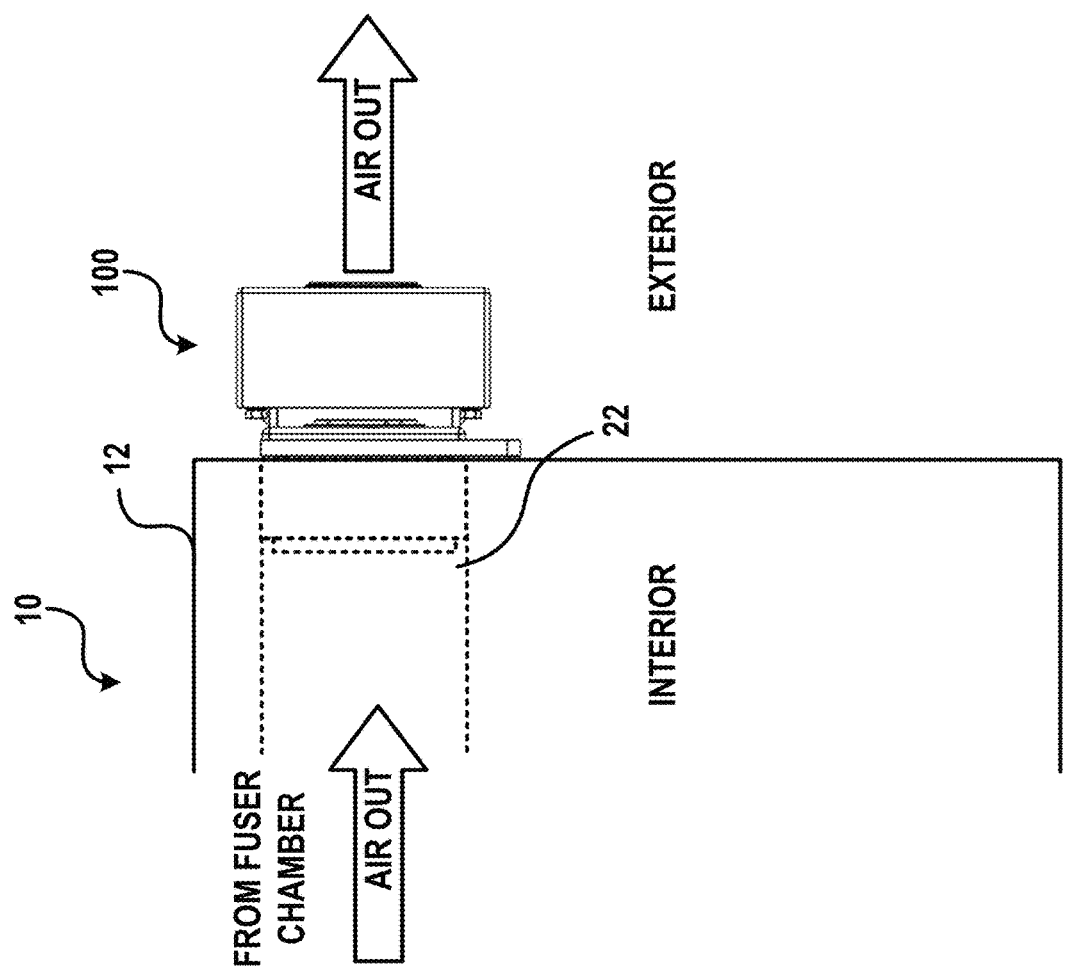
FIG. 4 is a side view showing the printer of FIG. 3A coupled with the adapted cooling system of FIG. 1 with the fuser chamber fan receptacle shown in phantom.
Figure 5A:
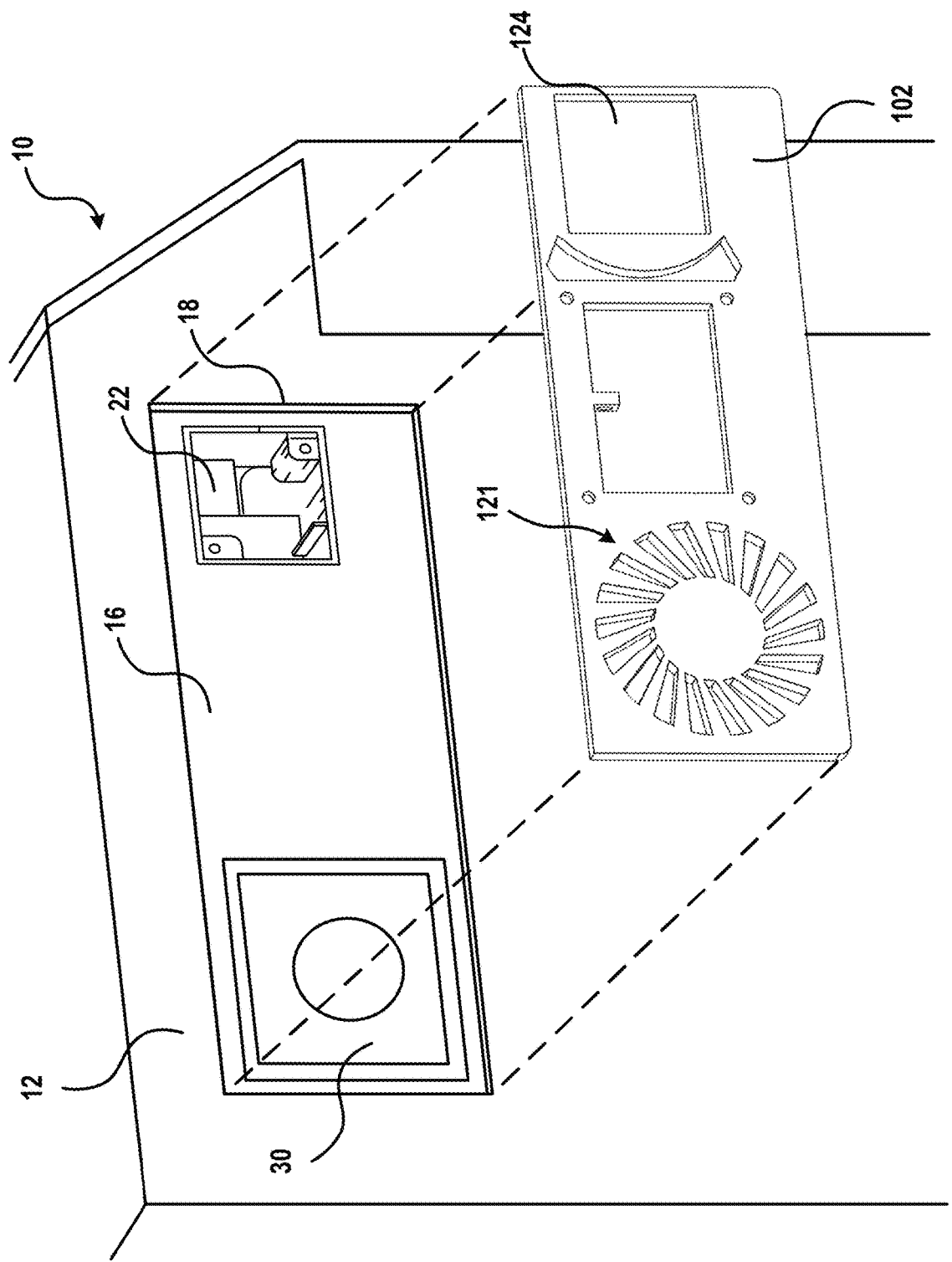
Figure 6A:
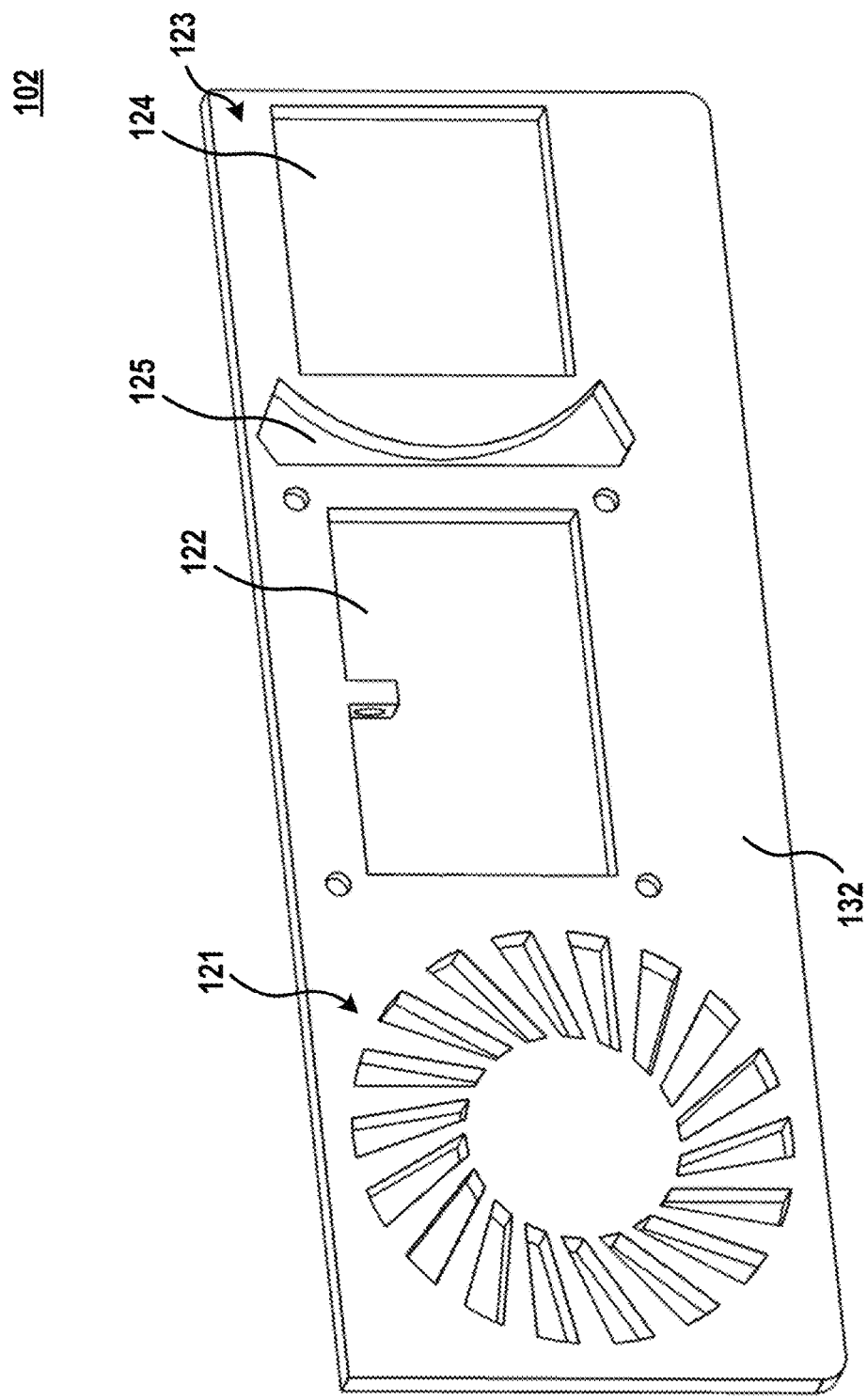
FIGS. 6A and 6B are respective front and rear perspective views showing the panel of FIG. 5A.
Figure 6B:
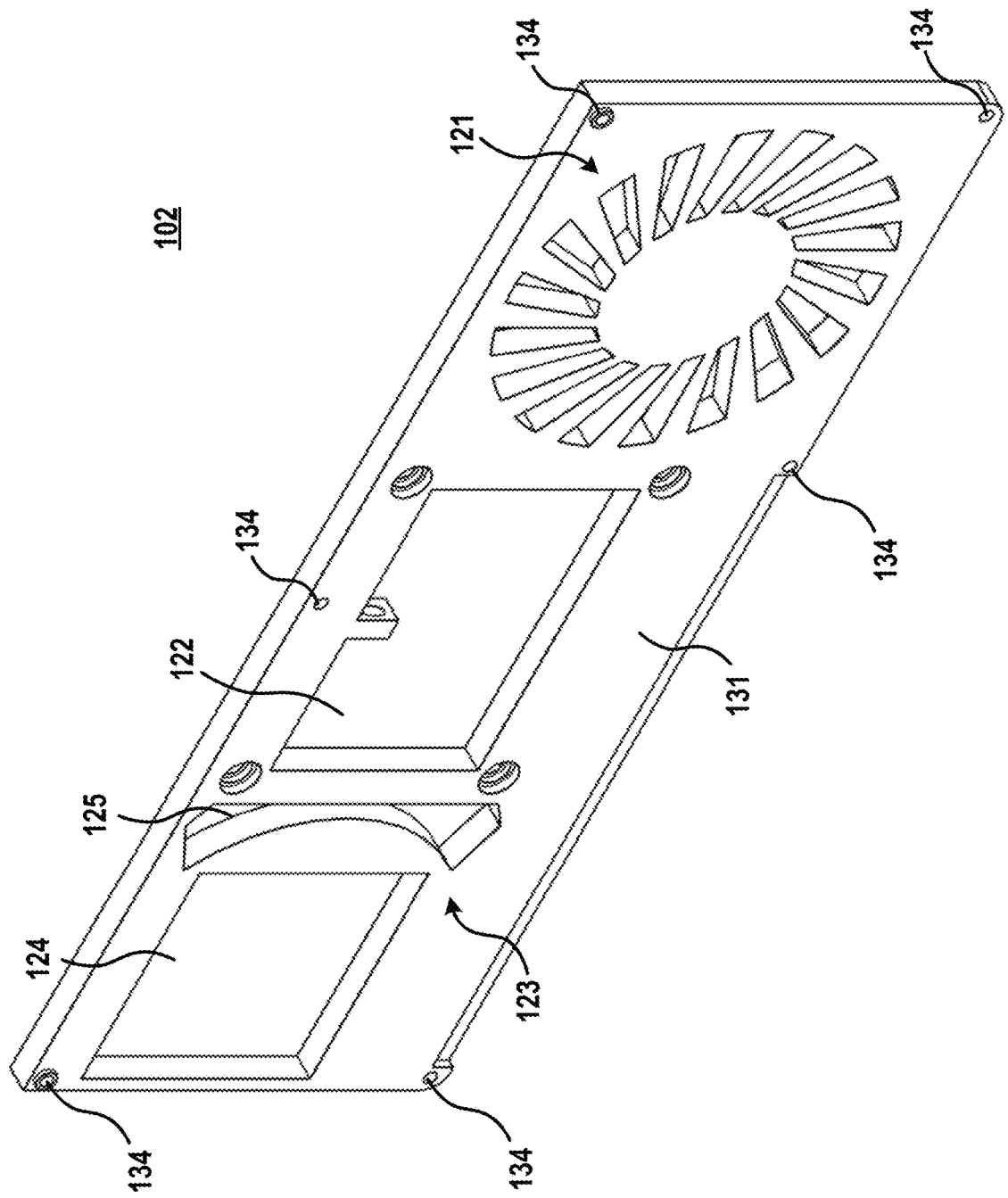

While the fan 106 is configured to replace the original fuser chamber fan 20 that communicates directly with the chamber within the printer 10 that houses the fuser unit, the second fan 30 is configured to draw hot air out of other locations within the printer 10. The panel 102 includes a plurality of vent apertures 121 that, when coupled to the printer housing 12 over the ventilation bay 16, enable the second fan 30 to communicate with an exterior of the printer housing 12 to force hot air out of the printer 10 as shown in FIGS. 5A and 5B. The panel 102 further includes an access receptacle 122 for receipt of an access sub-panel 108 that can be removed to expose a portion of the ventilation bay 16 and provide access to associated cables or wires that communicate power and signals between one or more electronic components of the printer 10 and the fan 106. As shown in FIGS. 3A-4, the panel 102 is configured for placement along the printer housing 12 of the printer 10; in some embodiments, the printer housing 12 includes an original vent panel 14 that can be removed to expose the ventilation bay 16 and replaced with the panel 102 of the adapted cooling system 100. In one aspect, the panel 102 is configured for retrofitting along the ventilation bay 16 of the printer housing 12. In some embodiments, the panel 102 can be positioned along a side of the printer housing 12 and near a top of the printer housing 12 as shown in FIG. 4.

As shown in FIGS. 1, 2 and 5A-6B, the panel 102 defines an inward-facing panel surface 131 that faces the interior of the printer housing 12 and an outward-facing panel surface 132 defined opposite to the inward-facing panel surface 131 that faces the exterior of the printer housing 12. In some embodiments, the panel 102 can include a plurality of panel fastening elements 133 that seat within respective panel fastening apertures 134 defined near a circumferential edge of the panel 102. The plurality of panel fastening elements 133 can be positioned along the inward-facing panel surface 131 of the panel 102. The plurality of panel fastening elements 133 can fix the panel 102 against the printer housing 12 by capturing a ventilation bay edge 18 of the printer housing 12 against each respective panel fastening element 133 and the inward-facing panel surface 131 of the panel 102.

Figure 7A:
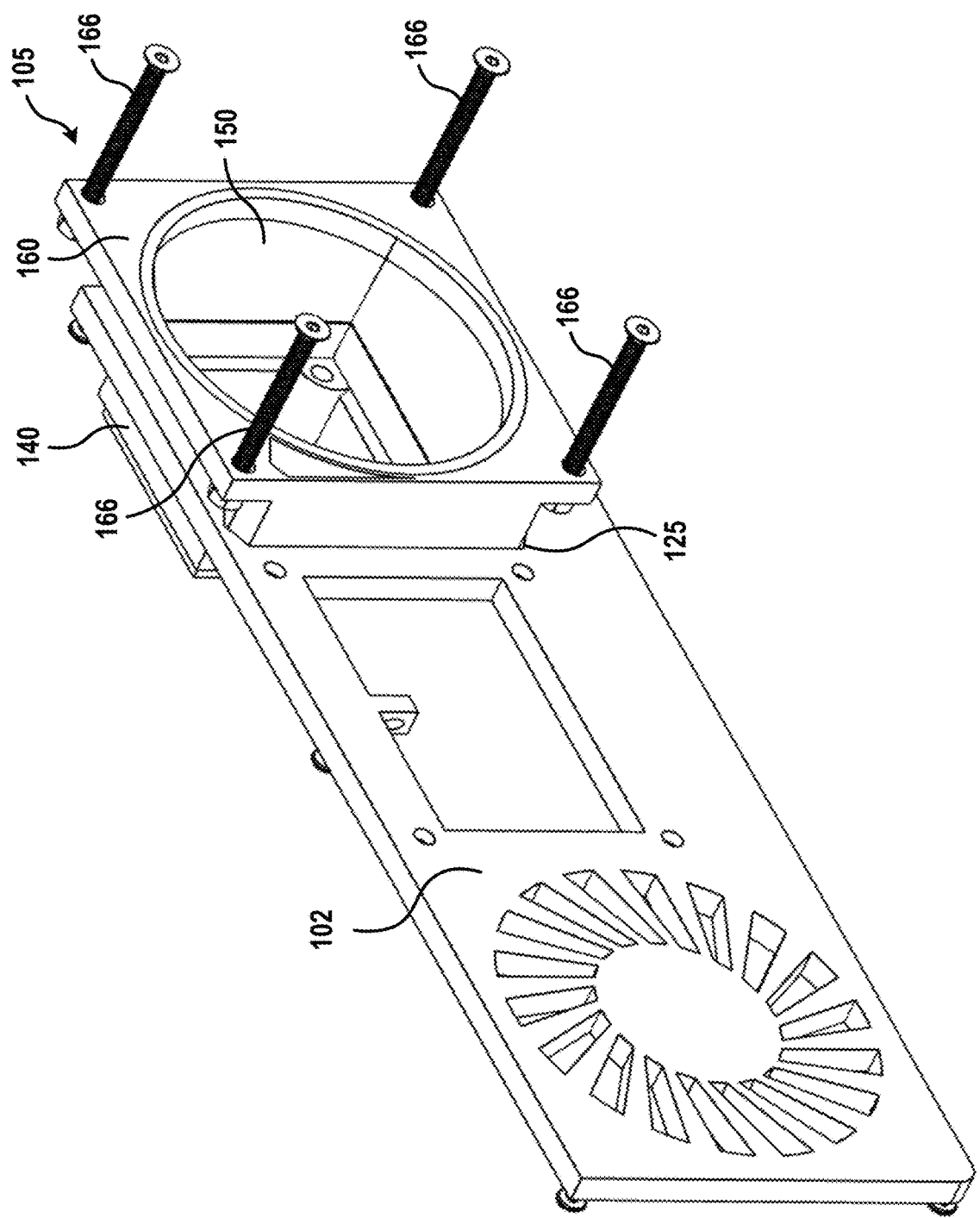
FIGS. 7A and 7B are respective front perspective and top views showing the panel of FIG. 5A coupled with a channel section of a manifold of the adapted cooling system of FIG. 1.
Figure 7B:
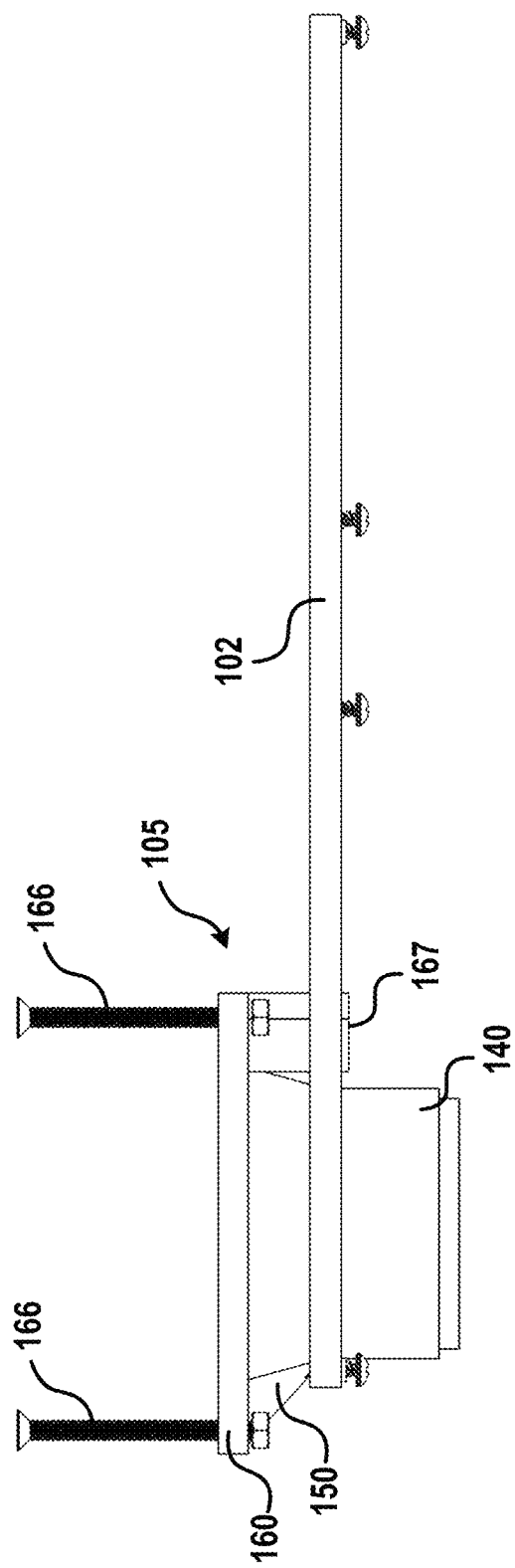
Figure 8:
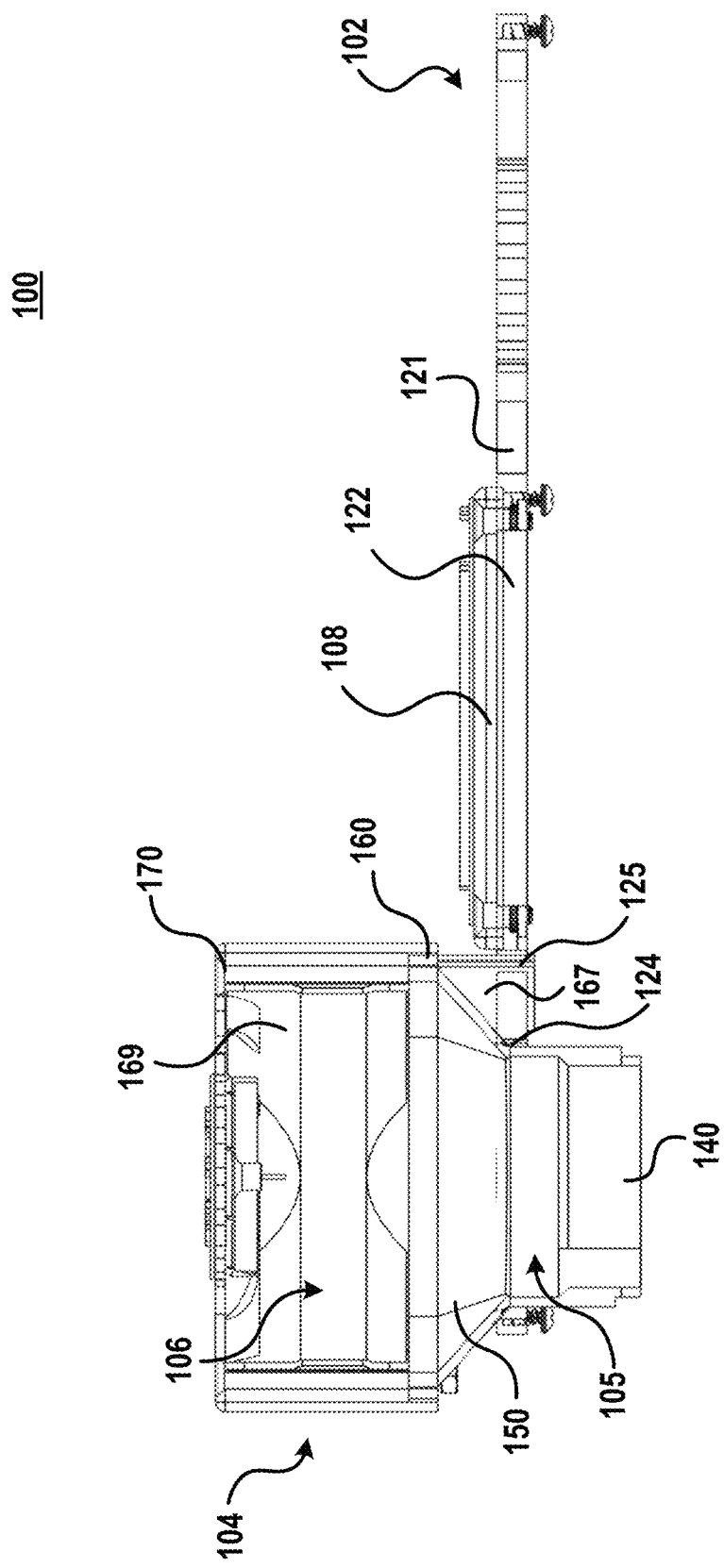
FIG. 8 is a top cross-sectional view showing the adapted cooling system of FIG. 1 taken along line 8-8 of FIG. 1.
Figure 10A:
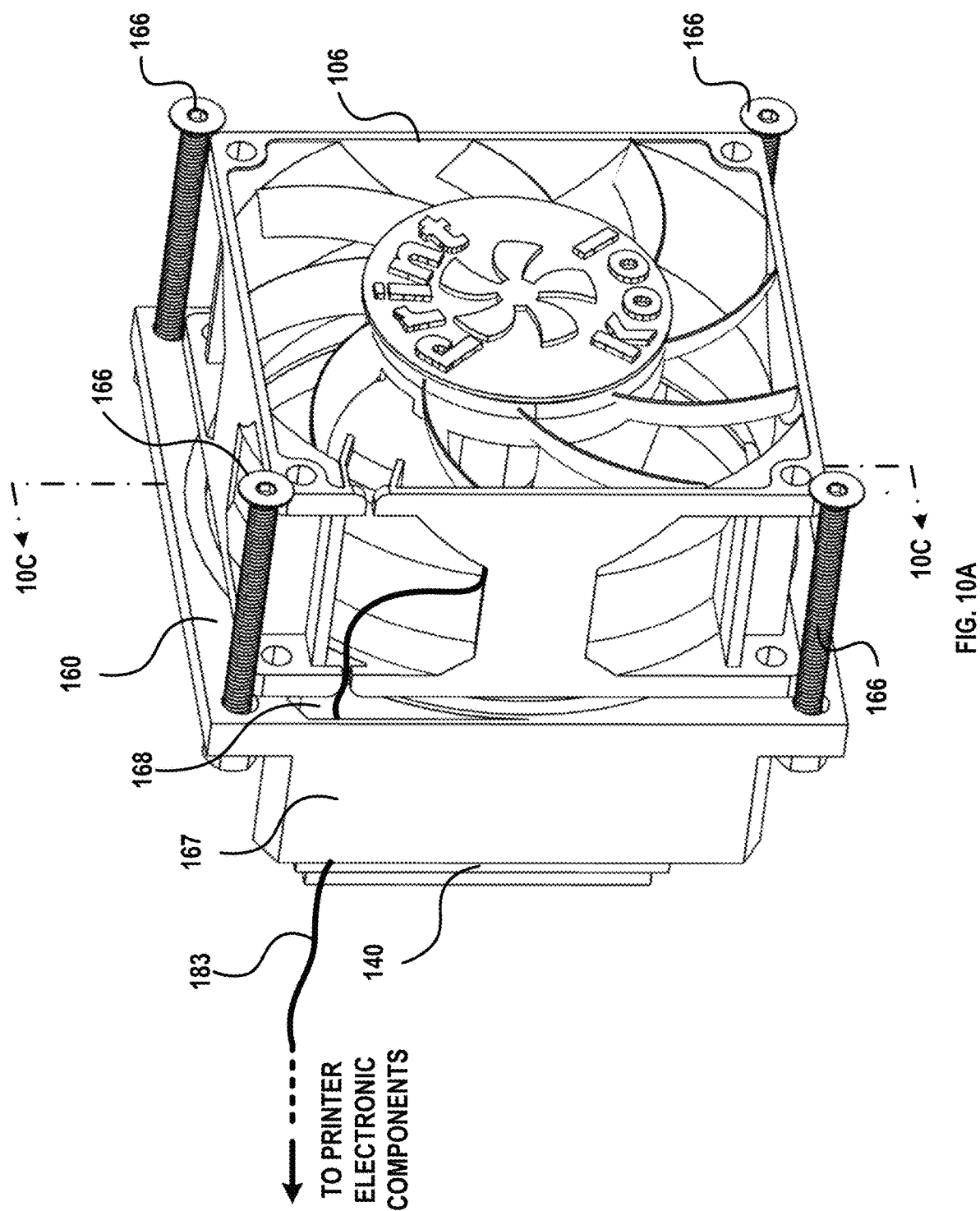
Figure 10D:
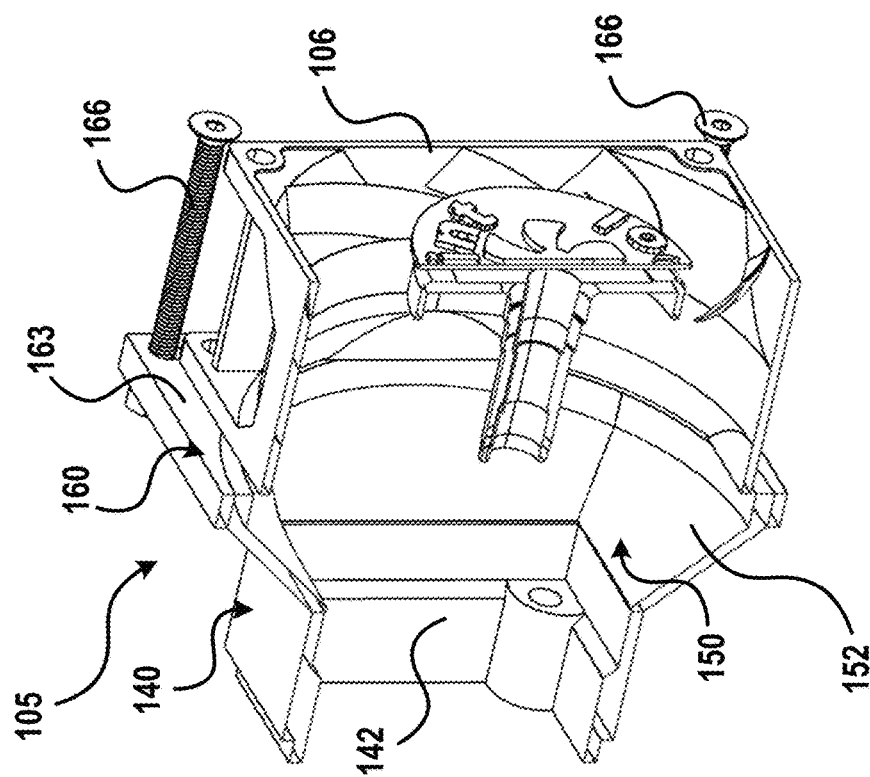
FIGS. 10C and 10D are respective front perspective and rear perspective cross-sectional views showing the manifold of FIG. 10A taken across line 10C-10C of FIG. 10A.
Figure 10C:
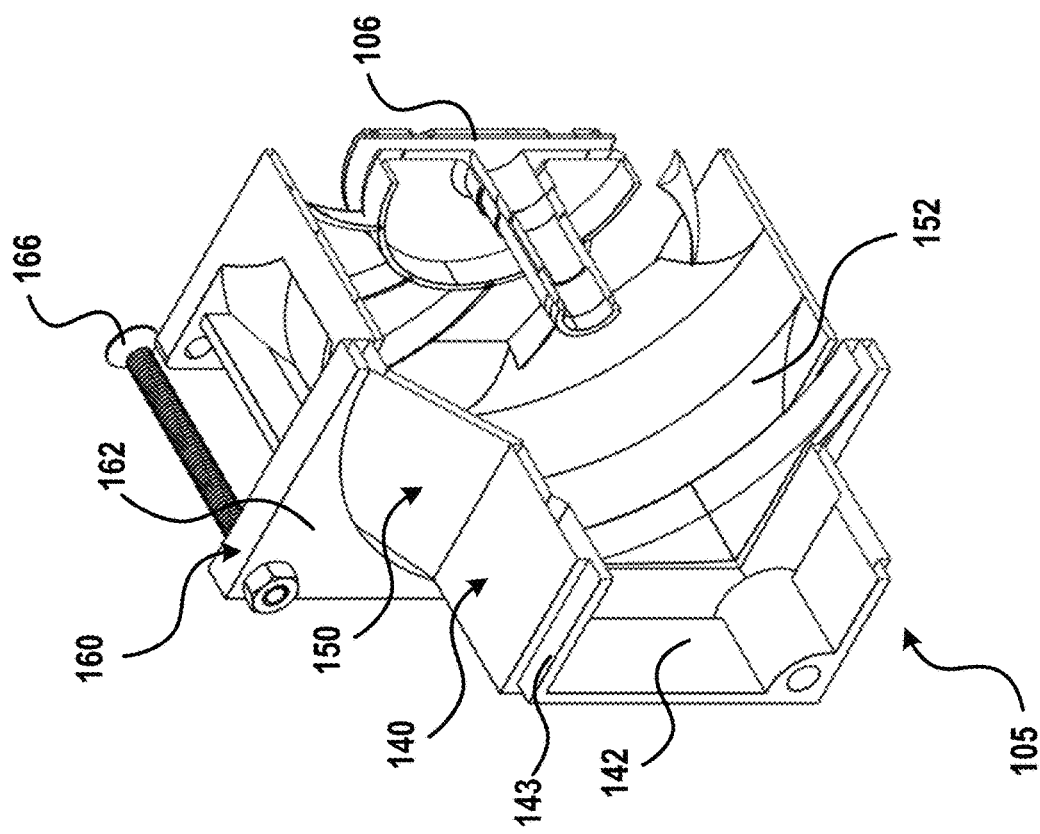

In some embodiments, with additional reference to FIGS. 7A-8, the panel 102 is separable from the manifold 104 and includes a manifold port 123 that couples the manifold 104 to the panel 102. The manifold port 123 includes a manifold receptacle 124 for receipt of the manifold 104, the manifold receptacle 124 being an aperture through the panel 102 that enables fluid flow communication between the interior and the exterior of the printer housing 12, and in particular, between the fuser chamber fan receptacle 22 and the exterior of the printer housing 12. The manifold port 123 further includes an arcuate slot 125 located adjacent to the manifold receptacle 124 for further securement of the manifold 104 to the panel 102. The arcuate slot 125 can enable passage of one or more cables 183 (FIG. 10A) that establish electrical connection between the fan 106 and one or more electronic components of the printer 10.

Figure 13:
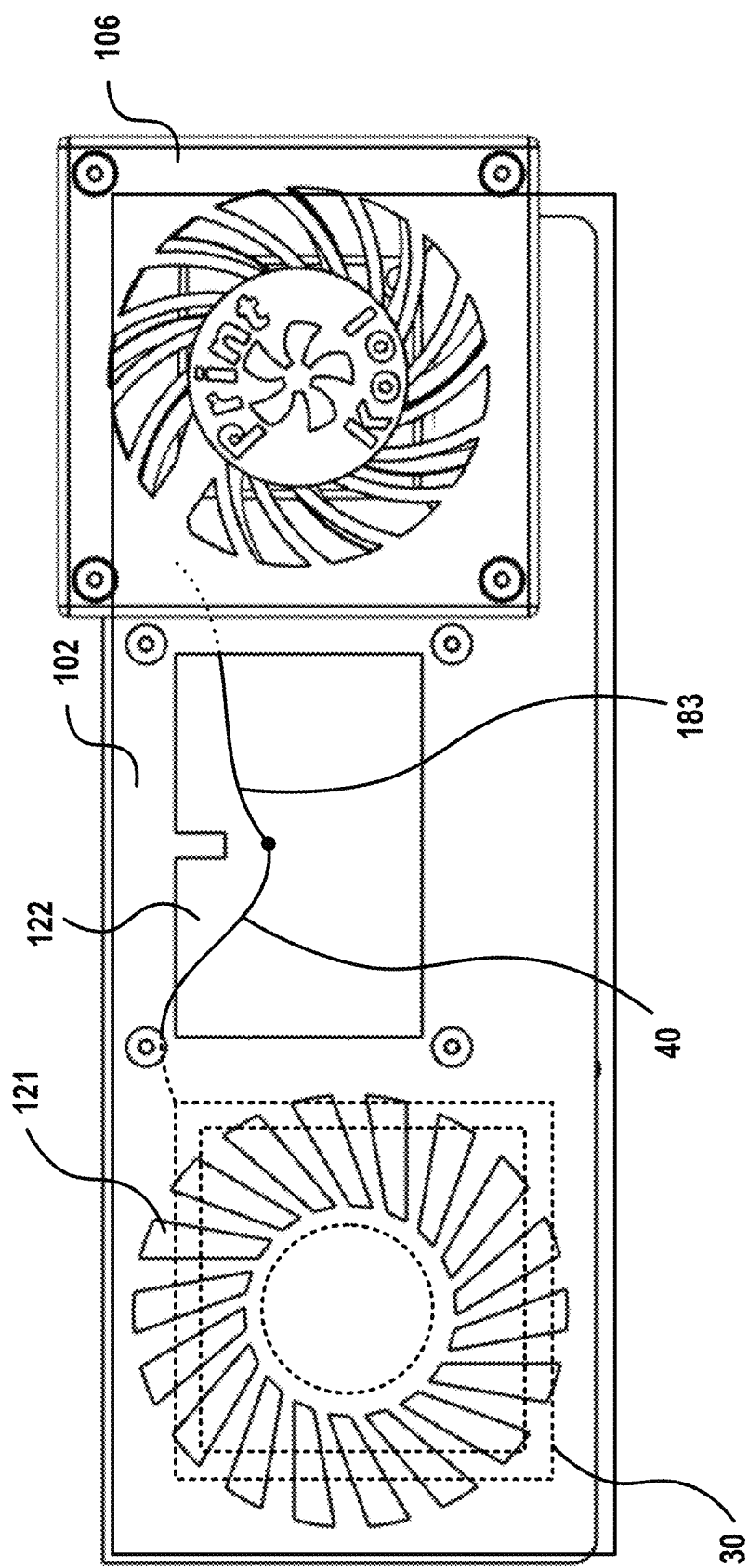
FIG. 13 is an illustration showing coupling of electrical connections of the fan of FIG. 10A with one or more existing cables of the printer.

In one aspect, the one or more cables 183 can be gathered and secured behind the access sub-panel 108 which removably couples with the access receptacle 122 of the panel 102 (see FIG. 13). In some embodiments, the access sub-panel 108 can include one or more logos or indicia. In some embodiments, the panel 102 and access sub-panel 108 can be manufactured by conventional processes such as molding, milling, or 3D printing. As shown, the access sub-panel 108 can couple with the panel 102 by one or more access panel fasteners 135.

Manifold

Referring to FIGS. 7A-11D, the manifold 104 secures the fan 106 to the panel 102, and by extension to the printer 10, while directing air flow between an exterior environment and the interior of the printer housing 12 accelerated through the fan 106. The manifold 104 includes a channel section 105 that establishes fluid-flow communication between the interior of the printer housing 12 and further includes a fan cover 170 that defines a fan cavity 169 that encapsulates the fan 106. As shown, the channel section 105 defines a rear channel section 140 that couples to the manifold receptacle 124 of the panel 102. In one aspect, the channel section 105 of the manifold 104 further defines an intermediate tapered section 150 located external to the rear channel section 140 that terminates at a plate ring 160 which couples to the panel 102 at the arcuate slot 125. The fan cover 170 couples directly with the plate ring 160 by a plurality of manifold fasteners 166. In particular, FIGS. 7A and 7B show engagement of the channel section 105 of the manifold 104 with the panel 102; FIG. 8 shows a cross-sectional view of the manifold 104 coupled with the panel 102, and FIGS. 9A-9D focus on the manifold 104 decoupled from the panel 102. In a primary embodiment, the rear channel section 140, the intermediate tapered section 150, and the plate ring 160 can collectively form a singular component. As such, the channel section 105 of the manifold 104 including the rear channel section 140, the intermediate tapered section 150, and the plate ring 160 can be formed in one piece or can be formed from multiple pieces that are coupled together. The components of the manifold 104 can be manufactured through an additive process (e.g., 3D printing), a reductive process (e.g., milling) and/or through a molding process.

Channel Section

Figure 11A:
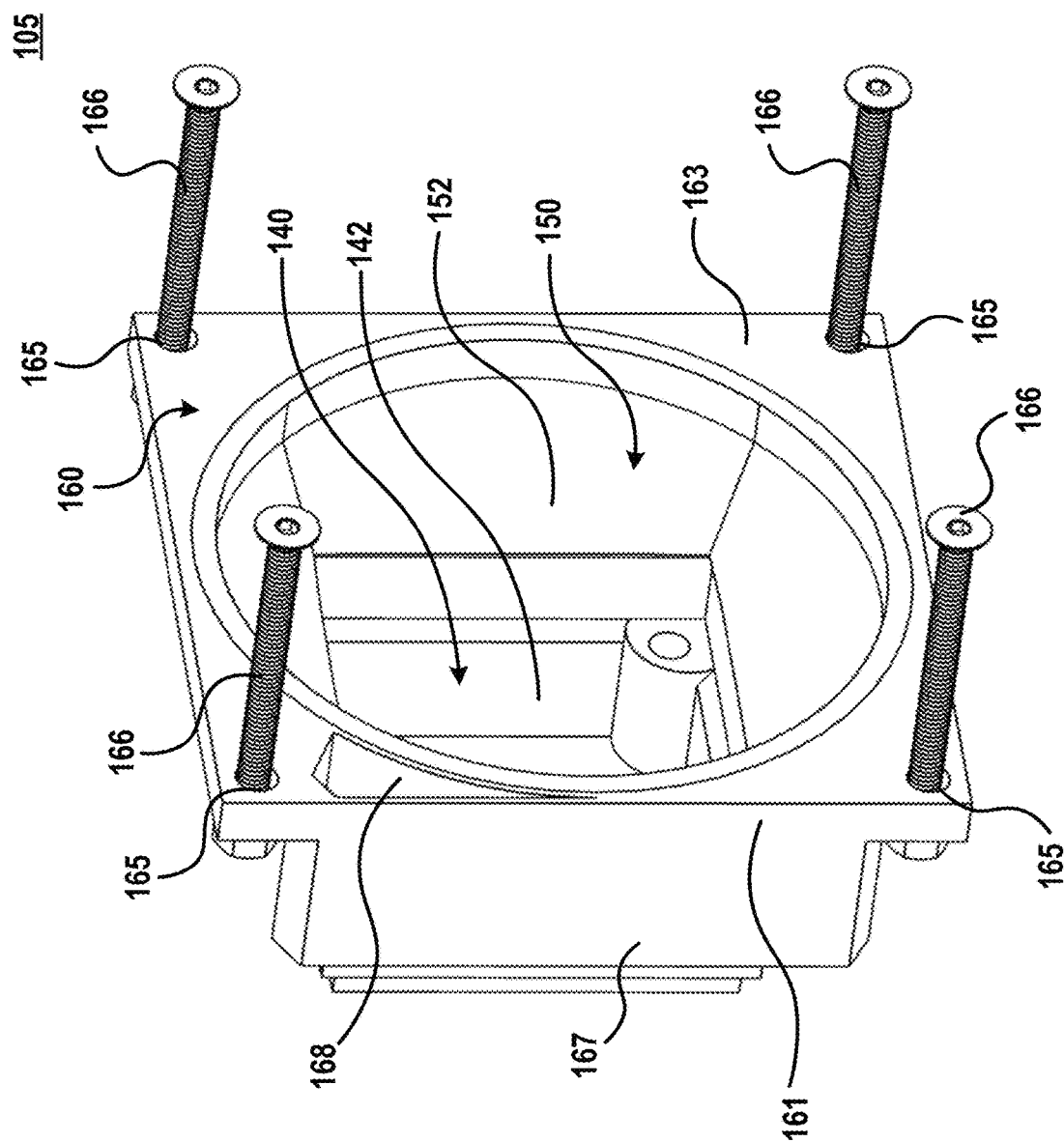
FIGS. 11A-11C are respective front perspective, first rear perspective and second rear perspective views showing the channel section of the manifold of FIG. 10A.
Figure 11B:
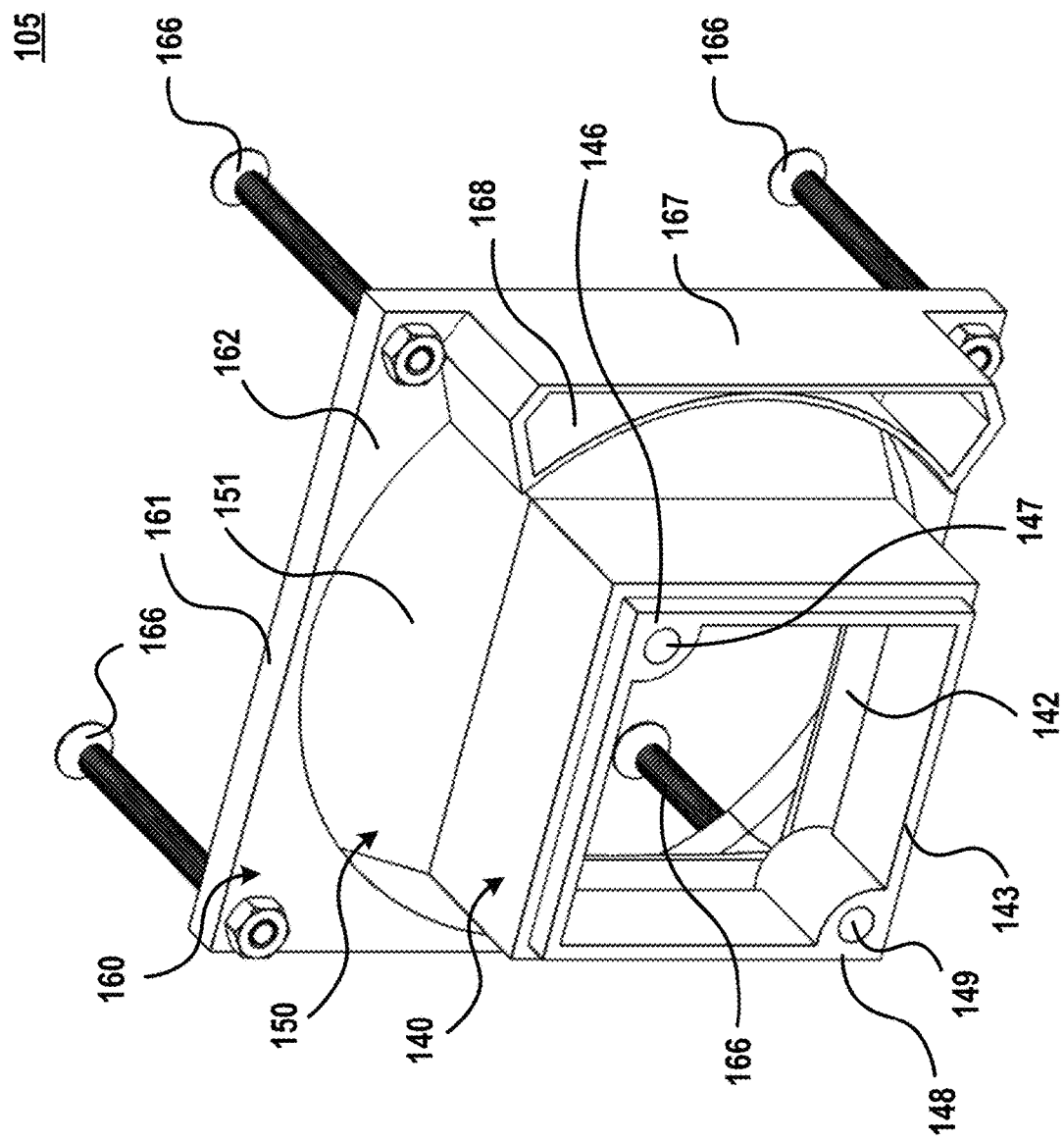
Figure 11C:
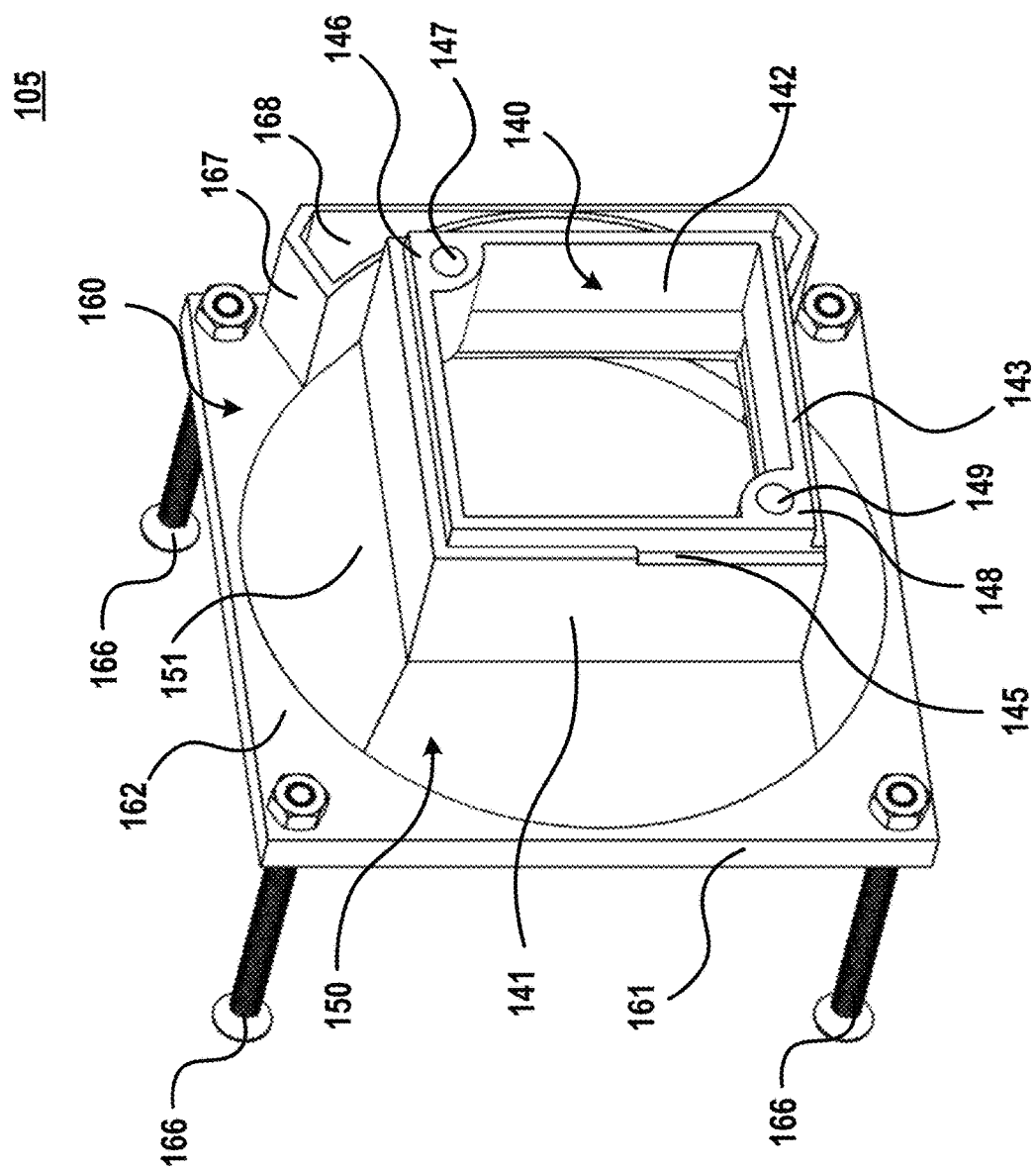

FIGS. 10A-10D show the channel section 105 of the manifold 104 coupled with the fan 106, with the fan cover 170 removed, and FIGS. 11A-11C show the channel section 105 without the fan 106 or the panel 102. In one embodiment, with continued reference to FIGS. 7A-11C, the channel section 105 of the manifold 104 includes the rear channel section 140 that secures the manifold 104 to the manifold port 123 of the panel 102 and provides a fluid-flow path between the interior of the printer housing 12 and the fan cavity 169. As shown, the rear channel section 140 defines a rear channel body 141 having an interior channel 142 that terminates at a first open end 143. The interior channel 142 establishes a fluid-flow connection between the first open end 143 and the intermediate tapered section 150, which includes a tapered interior channel 152 that continues the interior channel 142 of the rear channel section 140. In the embodiment shown, the rear channel section 140 defines a generally square and/or rectangular shape. The rear channel body 141 inserts directly into the manifold receptacle 124 of the panel 102 and couples within the fuser chamber fan receptacle 22 of the ventilation bay 16 in an engagement shown in FIG. 11D.

Figure 11D:
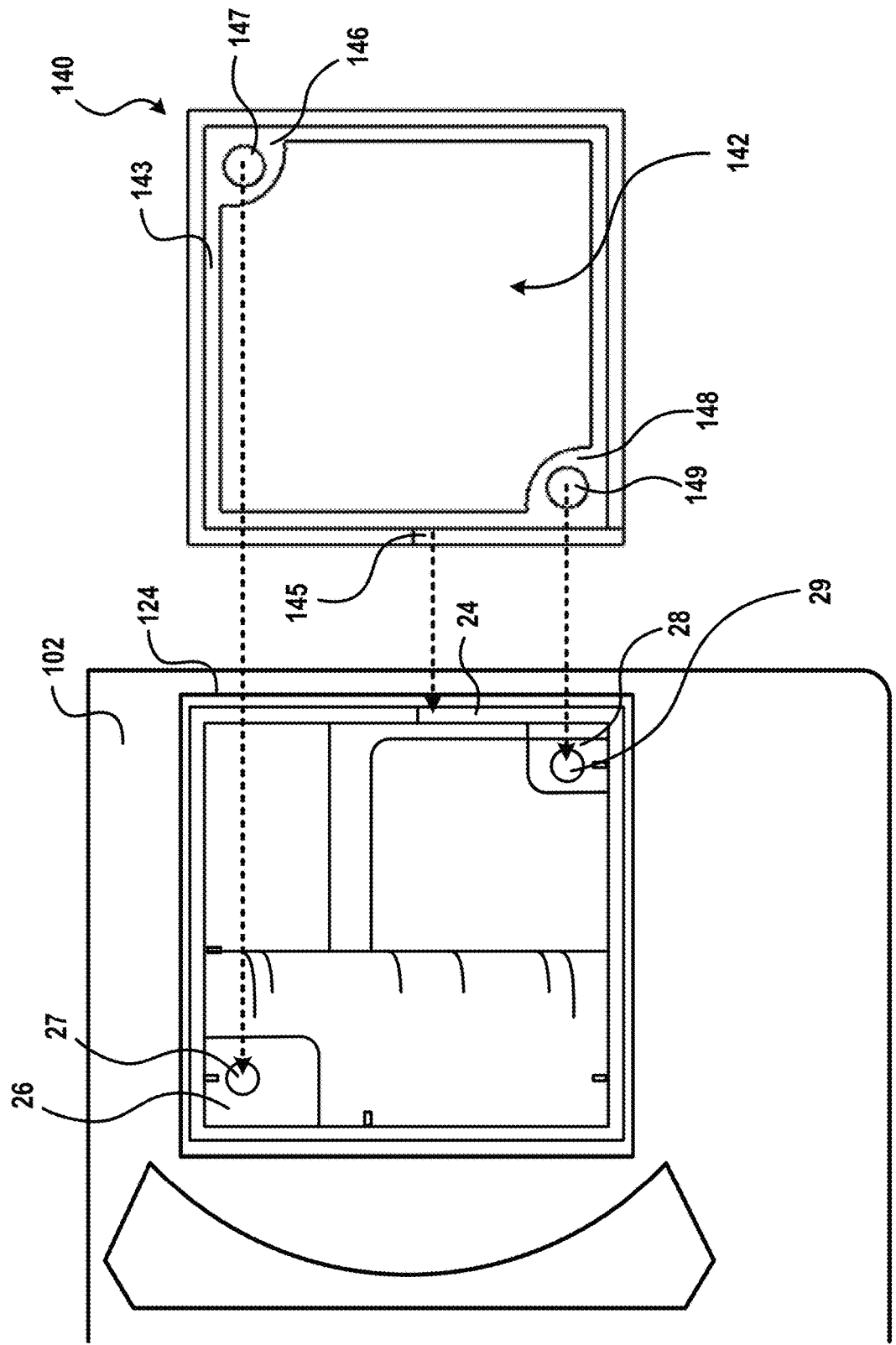
FIG. 11D is an illustration showing engagement of a rear channel section of FIG. 11B with the fuser chamber fan receptacle of FIG. 3D.

In some embodiments, with reference to FIGS. 11B-11D, the rear channel body 141 of the rear channel section 140 includes a first stabilization corner 146 having a first stabilization aperture 147 and a second stabilization corner 148 having a second stabilization aperture 149 that can provide structural support for the rear channel section 140 and can accept one or more fastening elements (not shown) to further secure the rear channel section 140 within the fuser chamber fan receptacle 22 of the ventilation bay 16. In particular, as shown in FIG. 11D, the fuser chamber fan receptacle 22 includes a first coupling corner 26 that includes a first coupling aperture 27 and a second coupling corner 28 that includes a second coupling aperture 29. The first coupling corner 26 and the second coupling corner 28 are originally configured to secure the original fuser chamber fan 20 within the ss 22. As shown, the first open end 143 of the rear channel section 140 couples within the fuser chamber fan receptacle 22 such that the first stabilization aperture 147 of the first stabilization corner 146 aligns with the first coupling aperture 27 of the first coupling corner 26 and the second stabilization aperture 149 of the second stabilization corner 148 aligns with the second coupling aperture 29 of the second coupling corner 28. As such, the first coupling aperture 27 and the first stabilization aperture 147 can collectively receive one or more fastener elements (not shown) to couple the first coupling corner 26 with the first stabilization corner 146; similarly, the second coupling aperture 27 and the second stabilization aperture 149 can collectively receive one or more fastener elements (not shown) to couple the second coupling corner 28 with the second stabilization corner 148. Further, as shown, the rear channel section 140 can include a notch 145 along the first open end 143 that couples with a tab 24 of the fuser chamber fan receptacle 22.

With continued reference to FIGS. 7A-11B, the channel section 105 further includes the intermediate tapered section 150 that directs air between the fan 106 and the printer housing 12. In some embodiments, the intermediate tapered section 150 continues the rear channel section 140. The intermediate tapered section 150 includes an intermediate tapered body 151 that defines the tapered interior channel 152, which terminates at the plate ring 160. In some embodiments, the plate ring 160 further couples with the fan cover 170 to collectively encapsulate the fan 106. As shown, the plate ring 160 and the intermediate tapered section 150 are positioned external to the printer housing 12 and the panel 102.

The plate ring 160 of the channel section 105 defines a planar body 161 having an inward-facing plate surface 162 that faces towards the interior of the printer housing 12 and an outward-facing plate surface 163 defined opposite from the inward-facing plate surface 162 that interfaces with the fan 106. The inward-facing plate surface 162 of the plate ring 160 defines an arcuate protrusion 167 that extends towards the panel 102 (and behind the fan cavity 169) and engages within the arcuate slot 125 of the panel 102 to provide an additional contact point between the manifold 104 and the panel 102. The arcuate protrusion 167 can include a cable channel 168 that communicates with the interior of the printer housing 12 when coupled to the printer 10 and extends through the plate ring 160 to communicate with the fan cavity 169. The cable channel 168 is configured to receive one or more cables 183 (FIG. 10A) for communication between the fan 106 and one or more internal electronic components of the printer 10. In another aspect, the arcuate protrusion 167 aids a user in orienting the manifold 104 when coupling the manifold 104 to the panel 102. In other embodiments, the plate ring 160 can include more than one point-of-contact with the panel 102. As shown, the plate ring 160 also defines a plurality of fastener apertures 165 configured to receive respective manifold fasteners 166 that secure the fan cover 170 to the plate ring 160.

Accommodating the Fan

Figure 9B:
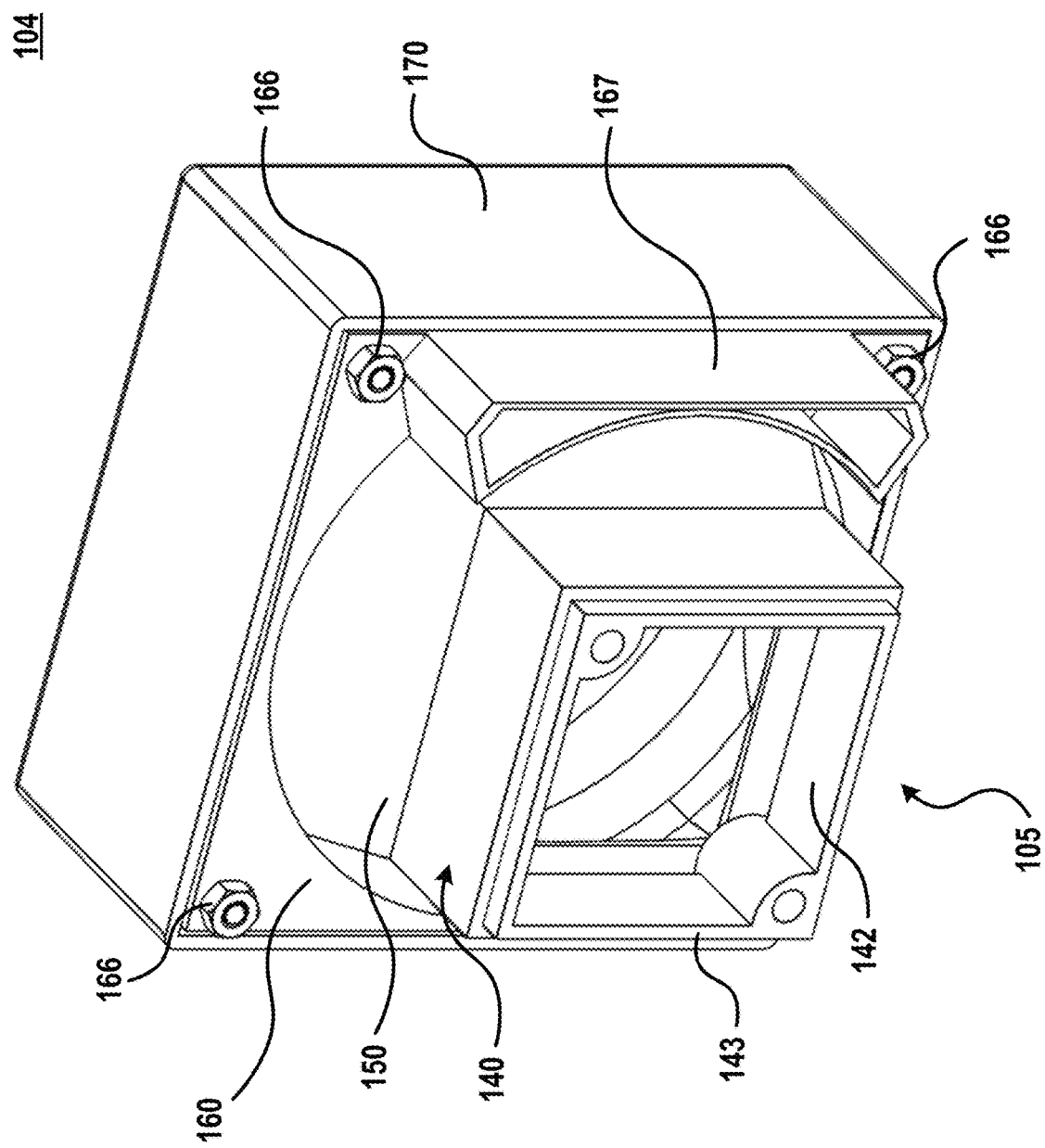
Figure 9C:
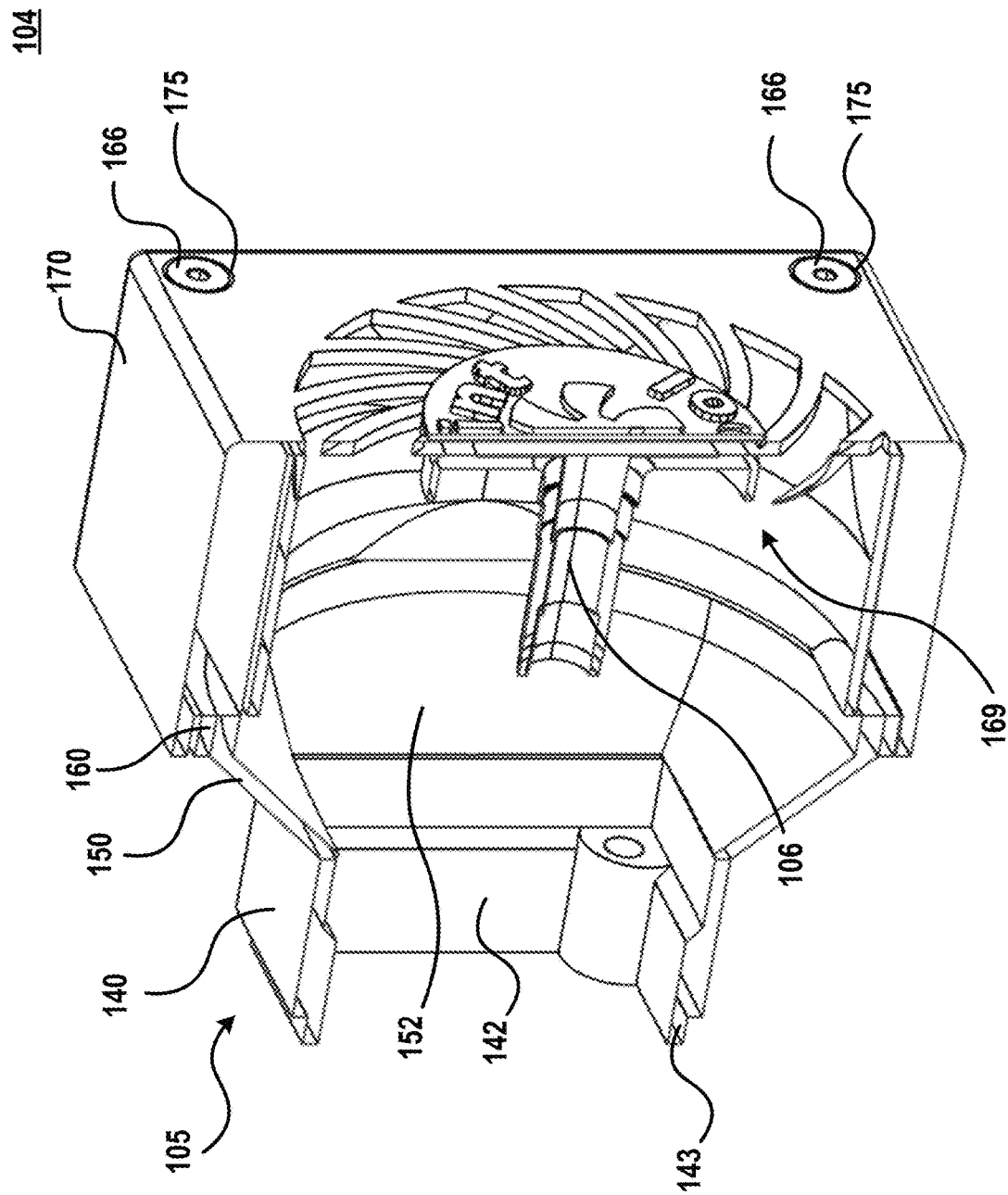
FIG. 9C is a cross-sectional view showing the manifold of FIG. 9A taken across line 9C-9C of FIG. 9A.
Figure 9D:
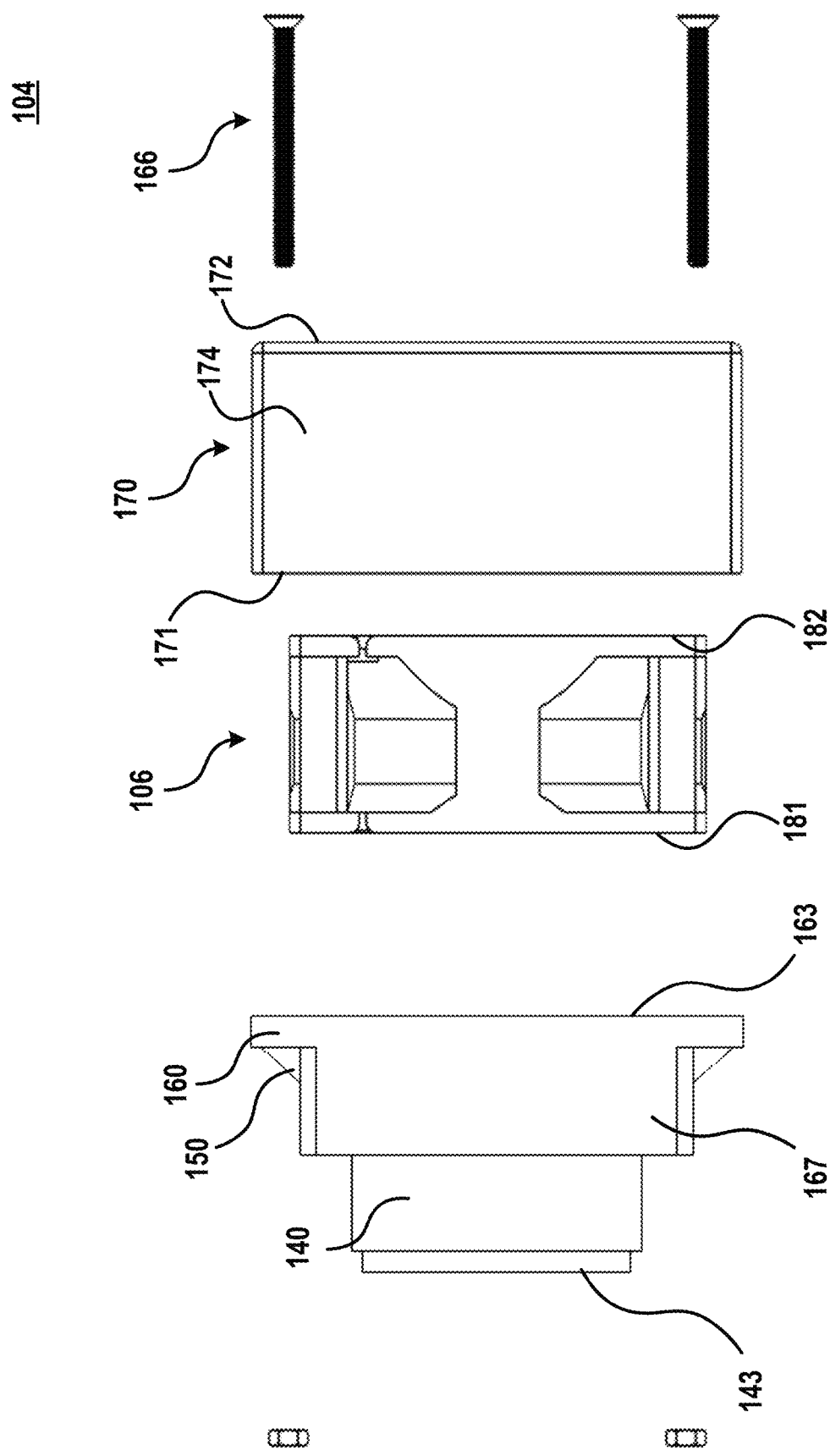
FIG. 9D is an exploded view showing the manifold of FIG. 9A.

With reference to FIGS. 8-9D, the fan cover 170 couples with the channel section 105 of the manifold 104 to encapsulate the fan 106. As such, the fan cover 170 and the channel section 105 of the manifold collectively define the fan cavity 169. In some embodiments, the fan cover 170 defines an open section 171 and a forward plate 172 defined opposite to the open section 171 that encloses the fan cavity 169. The open section 171 abuts against the outward-facing plate surface 163 of the plate ring 160 as shown in FIG. 9C. The forward plate 172 includes a plurality of fan apertures 173 that establish fluid flow communication between the fan cavity 169 and an external environment, allowing air to be drawn into the fan cavity 169 or forced out of the fan cavity 169 depending on the direction of the air flow moved by the fan 106. The plurality of fan apertures 173 should be large enough so as not to restrict airflow, but should be small enough to prevent debris, hair, or fingers from entering the fan cavity 169 when coupled with the channel section 105 of the manifold 104. The fan cover 170 further includes a sidewall section 174 that establishes a perimeter of the fan cavity 169, thereby encapsulating the fan 106 when the fan 106 is coupled within the manifold 104. As shown in FIG. 8, the sidewall section 174 fits over the fan 106 to secure it within the fan cavity 169. In one embodiment, the fan cavity 169 is configured to fit the exact dimensions of the fan 106. In one example embodiment, dimensions of the fan 106 are 80×80 mm vs 92×92 mm and the fan cavity 169 is sized appropriately; however, it should be noted that other dimensions of the fan 106 are contemplated, as such, the dimensions of the fan cover 170 and/or fan cavity 169 can be modified appropriately. Further, the fan cover 170 can also include a plurality of fastener channels 175 that align with the fastener apertures 165 of the plate ring 160 for receipt of the manifold fasteners 166 that secure the fan cover 170 to the plate ring 160. As shown, the manifold fasteners 166 can span from the forward plate 172 of the fan cover 170 and across the fan cavity 169 to connect with the plate ring 160.

The fan 106 includes a first side 181 and a second side 182 (FIG. 9D) defined opposite to the first side 181 and is operable for drawing and directing a flow of air from the first side 181 to the second side 182, or vice versa. When coupled within the manifold 104, the first side 181 of the fan 106 abuts against the plate ring 160 and the second side 182 of the fan is covered by the fan cover 170. As discussed, the fan cover 170 encapsulates the fan 106 and abuts against the outward-facing plate surface 163 of the plate ring 160.

Figure 12:
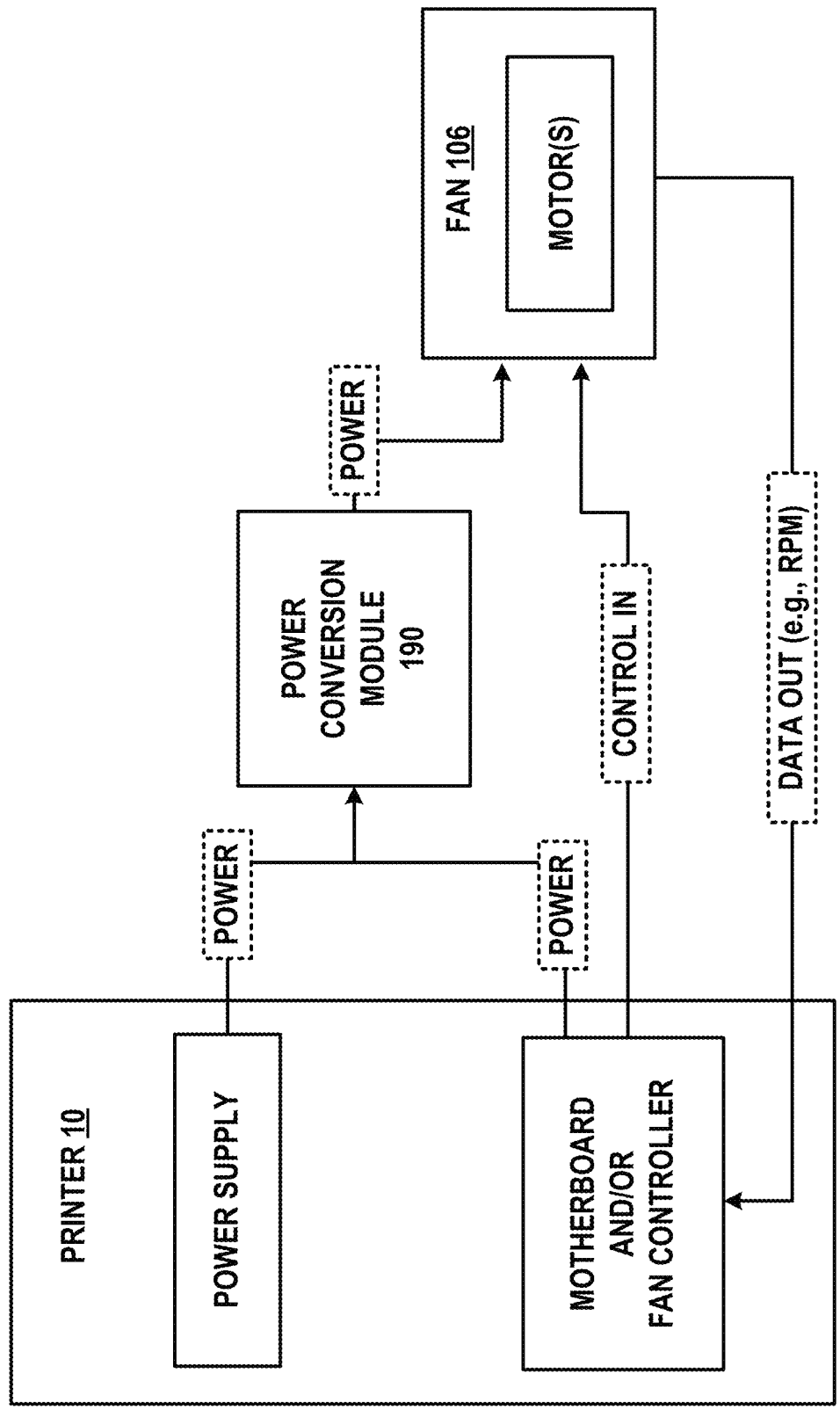
FIG. 12 is a simplified block diagram showing electrical connection of the fan of FIG. 10A with various electrical components of the printer.

With reference to FIGS. 12 and 13, the fan 106 can interface with one or more electronic components of the printer 10 through the one or more cables 183 which establish electrical connections between the fan 106 and the printer 10. In some embodiments, the one or more cables 183 are configured to couple with the one or more original cables 40 that connect to one or more internal components of the printer 10 and can be secured behind the access sub-panel 108 (FIG. 1). The one or more cables 183 can include one or more input cables that establish input connections that supply power and optionally a command signal (e.g., to toggle on or off, and/or to control a speed of a motor), to the fan 106. As such, operation of the fan 106 can be controlled by the printer 10. In some embodiments, the one or more cables 183 can include an output cable that establishes one or more output connections that carry operating data back to the printer 10. For example, the operating data communicated back to the printer 10 can include speed of the fan, which can include RPM (rotations per minute) value. Further, in some embodiments, the operating data can optionally include an "error" signal to communicate whether an error has occurred (e.g., if the fan 106 is not functioning properly). In some embodiments, the fan 106 can interface with one or more electronic components of the printer 10 which can include a motherboard and/or a fan controller, and optionally a power supply (as in some embodiments, the motherboard and/or fan controller can supply power to the fan 106 without the need for a direct connection to a power supply). In a further embodiment, the fan 106 can communicate with an additional power conversion module 190 that adapts the printer 10 to provide sufficient power to the fan 106, as the original electronic components of the printer 10 might not be configured to provide sufficient power to the fan 106 on their own.

Method

Figure 14B:
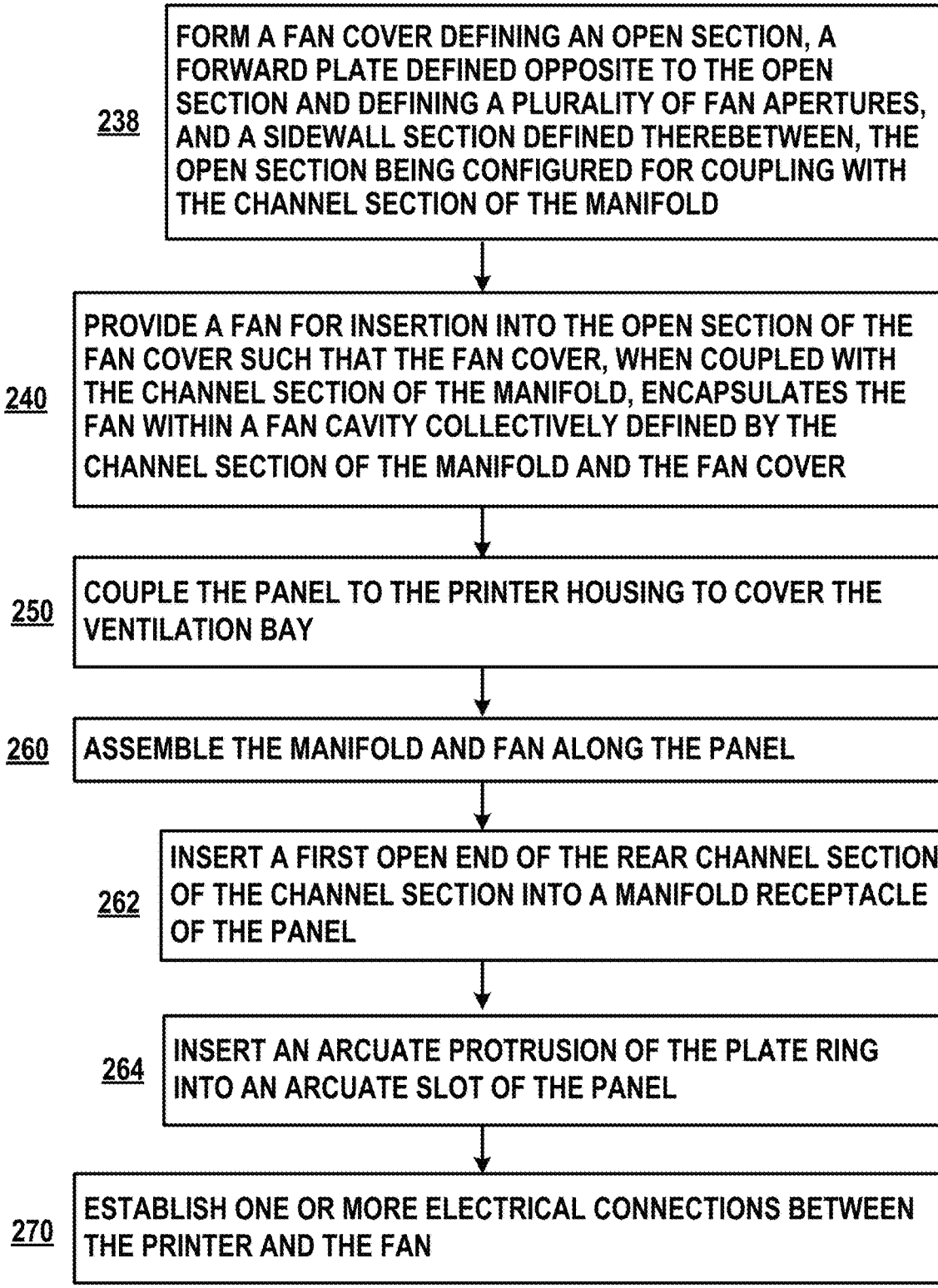

FIGS. 14A and 14B illustrate a simplified method 200 of manufacturing and assembling the adapted cooling system 100.

At step 210, the method 200 includes providing a printer having a printer housing and a ventilation bay. Step 220 includes forming a panel of an adapted cooling system including a plurality of vent apertures and a manifold port, the panel configured for installment along a printer housing and the manifold port defining a manifold receptacle and an arcuate slot.

Step 230 includes forming a channel section of a manifold configured for coupling with the panel and a fan. Step 230 includes sub-steps 232, 234, 236, and 238. Sub-step 232 includes forming a rear channel section defining a rear channel body having a first open end and an interior channel, the first open end being configured for insertion within the manifold receptacle of the manifold port. Sub-step 234 includes forming an intermediate tapered section defining an intermediate tapered body having a tapered interior channel. Sub-step 236 includes forming a plate ring defining a plate ring body having an inward-facing plate surface, an outward-facing plate surface defined opposite to the inward-facing plate surface, the inward-facing plate surface defining an arcuate protrusion configured for engagement within the arcuate slot of the manifold port. Sub-step 238 includes forming a fan cover defining an open section and a forward plate defined opposite to the open section and defining a plurality of fan apertures, and a sidewall section defined therebetween, the open section being configured for coupling with the channel section of the manifold.

Step 240 includes providing a fan for insertion into the open section of the fan cover such that the fan cover, when coupled with the channel section of the manifold, encapsulates the fan within a fan cavity collectively defined by the channel section of the manifold and the fan cover.

Step 250 includes coupling the panel to the printer housing to cover the ventilation bay. Step 260 includes assembling the manifold and fan along the panel, and includes sub-steps 262 and 264. Sub-step 262 includes inserting a first open end of the rear channel section of the channel section into a manifold receptacle of the panel. Sub-step 264 includes inserting an arcuate protrusion of the plate ring into an arcuate slot of the panel. Step 270 includes establishing one or more electrical connections between the printer and the fan.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

The invention claimed is:

1. A system, comprising:
 a manifold defining a fan cavity in fluid flow communication with a channel section, the fan cavity being configured to capture a fan within the fan cavity against the channel section, the channel section including:
  an interior channel terminating in a first open end;
  a tapered interior channel configured for establishing fluid flow communication between the interior channel and the fan cavity; and
  an arcuate protrusion that extends behind the fan cavity; and
 a panel configured to couple with a housing of an electronic device, the panel including:
  a manifold port configured to couple the manifold with the panel, including:
   a manifold receptacle configured to receive the first open end of the channel section; and an arcuate slot configured to receive the arcuate protrusion of the channel section;

wherein the manifold establishes fluid flow communication between an interior of the housing of the electronic device and an exterior of the housing of the electronic device.

2. The system of claim 1, wherein the manifold comprises:
a fan cover defining an open portion and a forward plate, the open portion being configured for engagement with the channel section and the forward plate including a plurality of fan apertures that enable fluid flow communication between the fan cavity and an exterior of the housing of the electronic device.

3. The system of claim 1, wherein the arcuate protrusion includes a cable channel configured to receive one or more cables that establish electrical communication between the fan and one or more electronic components of the electronic device.

4. The system of claim 1, wherein the channel section of the manifold includes:
a rear channel section that defines the interior channel terminating in the first open end, the rear channel section including a first stabilization corner having a first stabilization aperture and a second stabilization corner having a second stabilization aperture, the first stabilization aperture being configured for alignment with a first coupling aperture of a fuser chamber fan receptacle and the second stabilization aperture being configured for alignment with a second coupling aperture of the fuser chamber fan receptacle.

5. The system of claim 4, wherein the rear channel section includes a notch configured to couple with a tab of the fuser chamber fan receptacle.

6. The system of claim 1, wherein the channel section of the manifold includes:
a plate ring defining an inward-facing surface, wherein the arcuate protrusion extends from the inward-facing surface of the plate ring.

7. The system of claim 6, wherein the plate ring further includes:
an outward-facing surface opposite from the inward-facing surface, the outward-facing surface being configured to interface with the fan.

8. The system of claim 7, wherein the outward-facing surface is configured to interface with an open portion of a fan cover.

9. The system of claim 1, wherein the panel is configured for coupling along a ventilation bay of the electronic device.

10. The system of claim 1, wherein the panel includes a plurality of vent apertures configured to establish fluid-flow communication between a second fan positioned within a ventilation bay of the electronic device and an exterior of the electronic device.

11. A manifold, comprising: a channel section in fluid flow communication with a fan cavity, the channel section including: a rear channel section that defines an interior channel terminating in a first open end, the first open end being configured for insertion within a fuser chamber fan receptacle; an intermediate tapered section defining a tapered interior channel that establishes fluid flow communication between the interior channel and the fan cavity; and a plate ring defining an inward-facing surface and an arcuate protrusion extending from the inward-facing surface; wherein the fan cavity is configured to capture a fan against the channel section, wherein the manifold is configured for engagement with a panel positioned along a housing of an electronic device, wherein the panel includes a manifold port comprising: a manifold receptacle configured to receive the first open end of the rear channel section; and an arcuate slot configured to receive the arcuate protrusion of the plate ring.

12. The manifold of claim 11, wherein the rear channel section includes a first stabilization corner having a first stabilization aperture and a second stabilization corner having a second stabilization aperture, the first stabilization aperture being configured for alignment with a first coupling aperture of the fuser chamber fan receptacle and the second stabilization aperture being configured for alignment with a second coupling aperture of the fuser chamber fan receptacle.

13. The manifold of claim 11, wherein the rear channel section includes a notch configured to couple with a tab of the fuser chamber fan receptacle.

14. The manifold of claim 11, further comprising:
a fan cover including a sidewall section that encloses the fan cavity and encapsulates the fan, the fan cover defining an open section and a forward plate, the forward plate defining a plurality of fan apertures that establish fluid flow communication between exterior environment and the fan cavity.

15. The manifold of claim 14, wherein the open section is configured to couple with an outward-facing surface of the plate ring.

16. The manifold of claim 11, wherein the arcuate protrusion includes a cable channel that communicates between an interior of the housing of the electronic device and the fan cavity and is configured to enable passage of one or more cables for electrical communication between the electronic device and the fan.

17. A method, comprising: forming a panel of an adapted cooling system including a plurality of vent apertures and a manifold port, the manifold port comprising a manifold receptacle configured to receive a first open end of a rear channel section; and an arcuate slot configured to receive an arcuate protrusion of a plate ring, the panel configured for installment along a housing of an electronic device; forming a channel section of a manifold with a tapered interior configured for coupling with the manifold port of the panel and a fan; and forming a fan cover that defines a fan cavity defining an open section, a forward plate defined opposite to the open section and defining a plurality of fan apertures, and a sidewall section defined therebetween, the open section being configured for coupling with the channel section of the manifold.

18. The method of claim 17, further comprising:
providing the fan for insertion into the open section of the fan cover such that the fan cover, when coupled with the channel section of the manifold, encapsulates the fan within the fan cavity.

* * * * *